(12) United States Patent
Chen et al.

(10) Patent No.: US 11,309,423 B2
(45) Date of Patent: Apr. 19, 2022

(54) FIN FIELD EFFECT TRANSISTOR (FINFET) DEVICE STRUCTURE AND METHOD FOR FORMING THE SAME

(71) Applicant: Taiwan Semiconductor Manufacturing Co., Ltd., Hsinchu (TW)

(72) Inventors: Wei-Barn Chen, Tainan (TW); Ting-Huang Kuo, Tainan (TW); Shiu-Ko Jangjian, Tainan (TW); Chi-Cherng Jeng, Tainan (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/396,852

(22) Filed: Apr. 29, 2019

(65) Prior Publication Data
US 2019/0252547 A1    Aug. 15, 2019

Related U.S. Application Data

(62) Division of application No. 15/692,085, filed on Aug. 31, 2017, now Pat. No. 10,276,720.

(51) Int. Cl.
*H01L 29/78* (2006.01)
*H01L 21/762* (2006.01)
(Continued)

(52) U.S. Cl.
CPC .... *H01L 29/7851* (2013.01); *H01L 21/76229* (2013.01); *H01L 21/823412* (2013.01);
(Continued)

(58) Field of Classification Search
CPC .......... H01L 21/823431; H01L 21/845; H01L 27/0924; H01L 27/10826; H01L 21/76229;
(Continued)

(56) References Cited

U.S. PATENT DOCUMENTS 8,772,109 B2   7/2014   Colinge
8,785,285 B2   7/2014   Tsai et al.
(Continued)

FOREIGN PATENT DOCUMENTS

CN   105470295 A   4/2016
CN   105814672 A   7/2016
TW   201635352    10/2016

OTHER PUBLICATIONS

Chinese language office action dated May 4, 2018, issued in application No. TW 106135928.
(Continued)

*Primary Examiner* — Shahed Ahmed
(74) *Attorney, Agent, or Firm* — McClure, Qualey & Rodack, LLP

(57) ABSTRACT

A FinFET device structure and method for forming the same are provided. The FinFET device structure includes a first fin structure over a substrate, and a second fin structure over the substrate. The FinFET device structure also includes a first isolation structure over the substrate and surrounding the first fin structure. The first fin structure is protruded from a top surface of the first isolation structure. The FinFET device structure further includes a second isolation structure over the substrate and surrounding the second fin structure. The second fin structure is protruded from a top surface of the second isolation structure, and the first fin structure has a vertical sidewall surface and the second fin structure has a sloped sidewall surface.

20 Claims, 26 Drawing Sheets

(51) Int. Cl.
   *H01L 21/8234* (2006.01)
   *H01L 49/02* (2006.01)
   *H01L 29/66* (2006.01)
   *H01L 27/06* (2006.01)
   *H01L 27/088* (2006.01)

(52) U.S. Cl.
   CPC ......... *H01L 21/823431* (2013.01); *H01L 21/823481* (2013.01); *H01L 27/0629* (2013.01); *H01L 27/0886* (2013.01); *H01L 28/40* (2013.01); *H01L 29/66795* (2013.01); *H01L 29/7853* (2013.01)

(58) Field of Classification Search
   CPC ......... H01L 21/823481; H01L 27/0629; H01L 28/40; H01L 21/6224; H01L 27/0886; H01L 29/785–7856; H01L 29/66795–66818; H01L 27/10879; H01L 27/1211; H01L 29/41791; H01L 29/7851
   See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,786,510 B2 | 10/2017 | Shen et al. |
| 9,818,648 B2 | 11/2017 | Chao et al. |
| 10,950,488 B2 | 3/2021 | Kim et al. |
| 2008/0128797 A1 | 6/2008 | Dyer et al. |
| 2013/0102116 A1 | 4/2013 | Xiao et al. |
| 2013/0200395 A1* | 8/2013 | Liaw ............... H01L 27/11 257/77 |
| 2014/0001562 A1* | 1/2014 | Liaw ............ H01L 21/823821 257/369 |
| 2015/0028426 A1* | 1/2015 | Ching ............. H01L 29/785 257/401 |
| 2015/0187634 A1* | 7/2015 | Chiang ......... H01L 29/66795 257/401 |
| 2016/0104705 A1* | 4/2016 | Chung ......... H01L 21/823431 257/347 |
| 2017/0358455 A1 | 12/2017 | Shen et al. |
| 2018/0090335 A1* | 3/2018 | Karve ............ H01L 21/0337 |
| 2018/0323281 A1* | 11/2018 | Cheng ......... H01L 21/823481 |
| 2020/0013777 A1* | 1/2020 | Kim ............. H01L 27/0207 |

OTHER PUBLICATIONS

Chinese language office action dated Apr. 6, 2021, issued in application No. CN 201711217315.1.

* cited by examiner

FIN FIELD EFFECT TRANSISTOR (FINFET) DEVICE STRUCTURE AND METHOD FOR FORMING THE SAME

CROSS REFERENCE TO RELATED APPLICATIONS

This application is a Divisional application of U.S. patent application Ser. No. 15/692,085, filed on Aug. 31, 2017, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
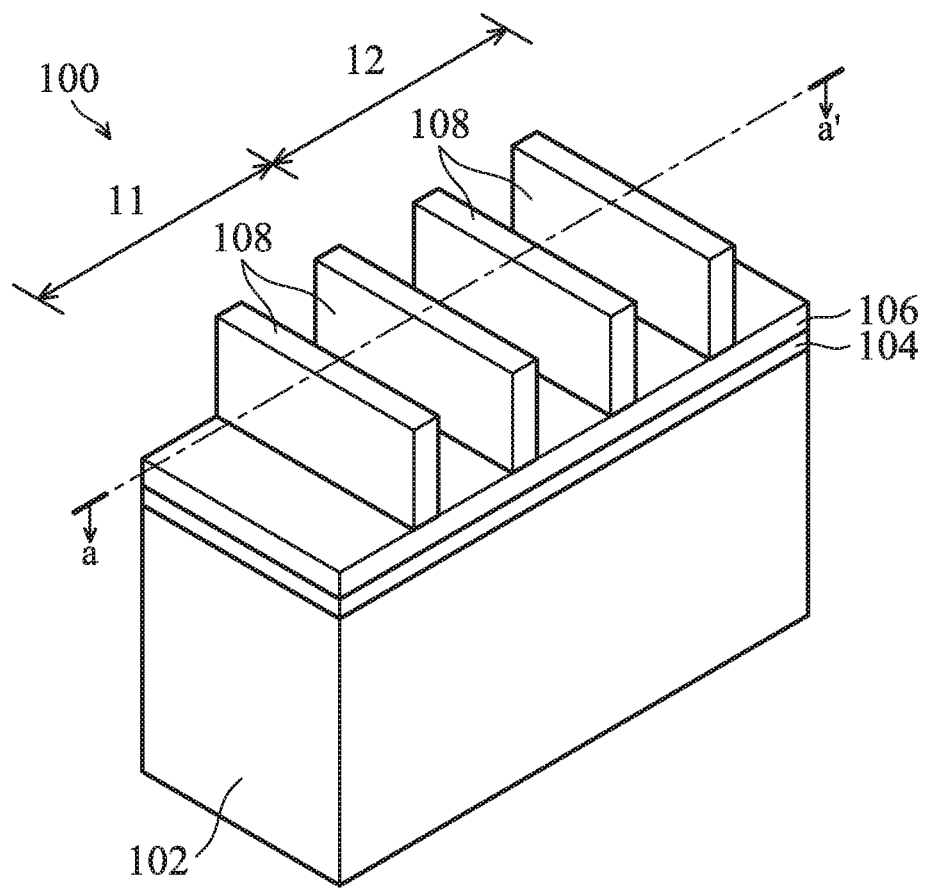
FIGS. 1A-1I show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for forming a fin field effect transistor (FinFET) device structure are provided. FIGS. 1A-1I show perspective representations of various stages of forming a FinFET device structure 100, in accordance with some embodiments of the disclosure. FIGS. 2A-2I show cross-sectional representations of various stages of forming the FinFET device structure 100 shown in FIGS. 1A-1I. FIGS. 2A-2I show cross-sectional representations taken along line aa' in FIGS. 1A-1I.

Referring to FIG. 1A, a substrate 102 is provided. The substrate 102 includes a first region 11 and a second region 12. The substrate 102 may be made of silicon or other semiconductor materials. In some embodiments, the substrate 102 is a silicon wafer. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 2A:
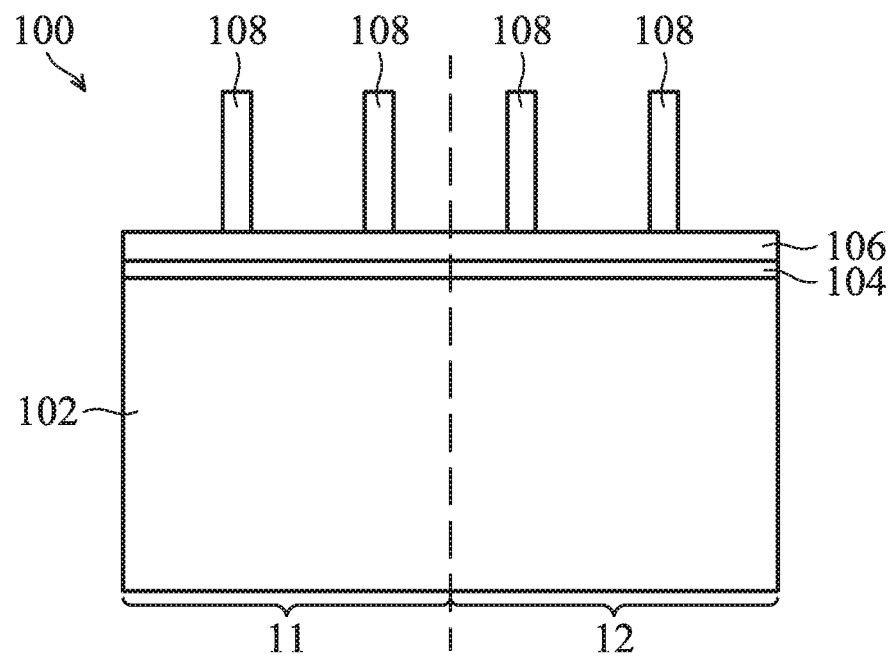
FIGS. 2A-2I show cross-sectional representations of various stages of forming the FinFET device structure shown in FIGS. 1A-1I.
Figure 1B:
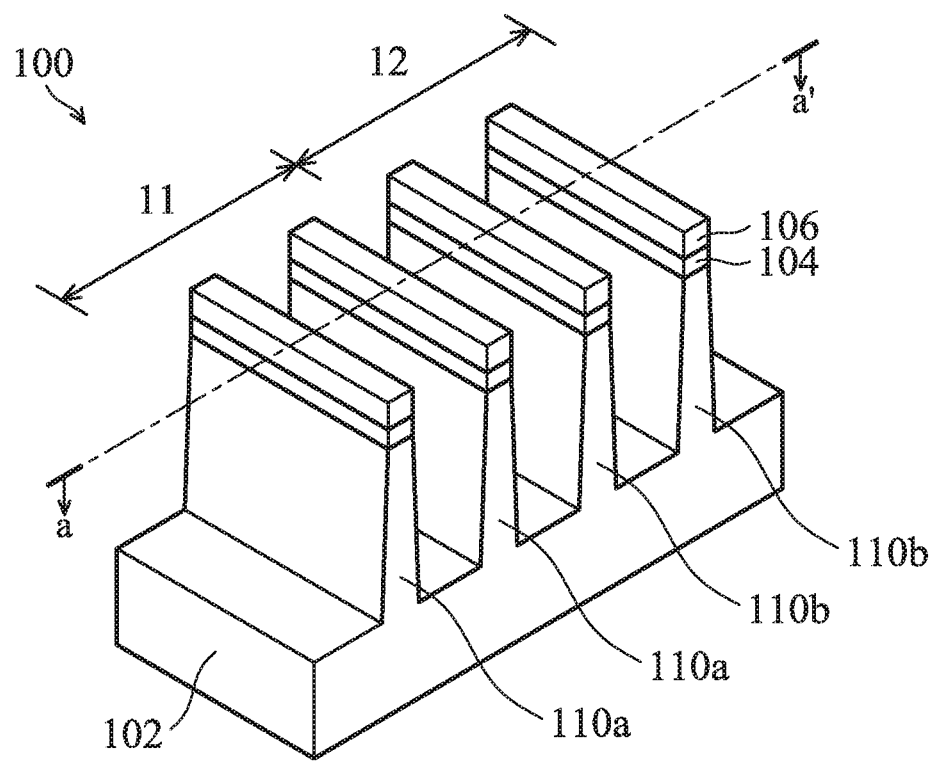
Figure 2B:
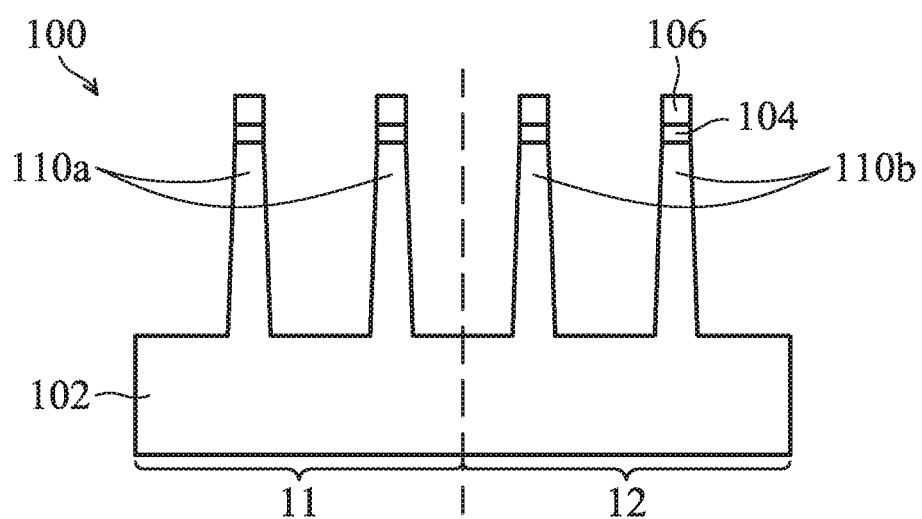

As shown in FIGS. 1B and 2B, after the photoresist layer 108 is patterned, the dielectric layer 104 and the mask layer 106 are patterned by using the patterned photoresist layer 108 as a mask, in accordance with some embodiments. As a result, a patterned dielectric layer 104 and a patterned mask layer 106 are obtained. Afterwards, the patterned photoresist layer 108 is removed.

Afterwards, an etching process is performed on the substrate 102 to form a number of fin structures 110a, 110b by using the patterned dielectric layer 104 and the patterned mask layer 106 as a mask. The fin structures 110a, 110b include first fin structures 110a in the first region 11 and second fin structures 110b in the second region 12. In some embodiments, each of the fin structures 110a, 110b has a width that gradually increases from the top portion to the bottom portion. In other words, each of the fin structures 110a, 110b has a tapered fin width which is gradually tapered from the bottom portion to the top portion.

The etching process may be a dry etching process or a wet etching process. In some embodiments, the substrate 102 is etched using a dry etching process. The dry etching process includes using a fluorine-based etchant gas, such as $SF_6$, $C_xF_y$, $NF_3$ or a combination thereof. The etching process may be a time-controlled process, and continue until the fin structures 110a, 110b reach a predetermined height.

Before forming the isolation layer 112 (shown in FIG. 3C), a thermal oxidation process may be optionally performed on the fin structures 110a, 110b to repair any damage to the sidewall surfaces of the fin structures 110a, 110b during the etching process. It should be noted that although only four fin structures 110a, 110b shown in FIGS. 1A-1I and FIGS. 2A-2I, the number of the fin structures 110a, 110b may be changed according to actual application.

Figure 1C:
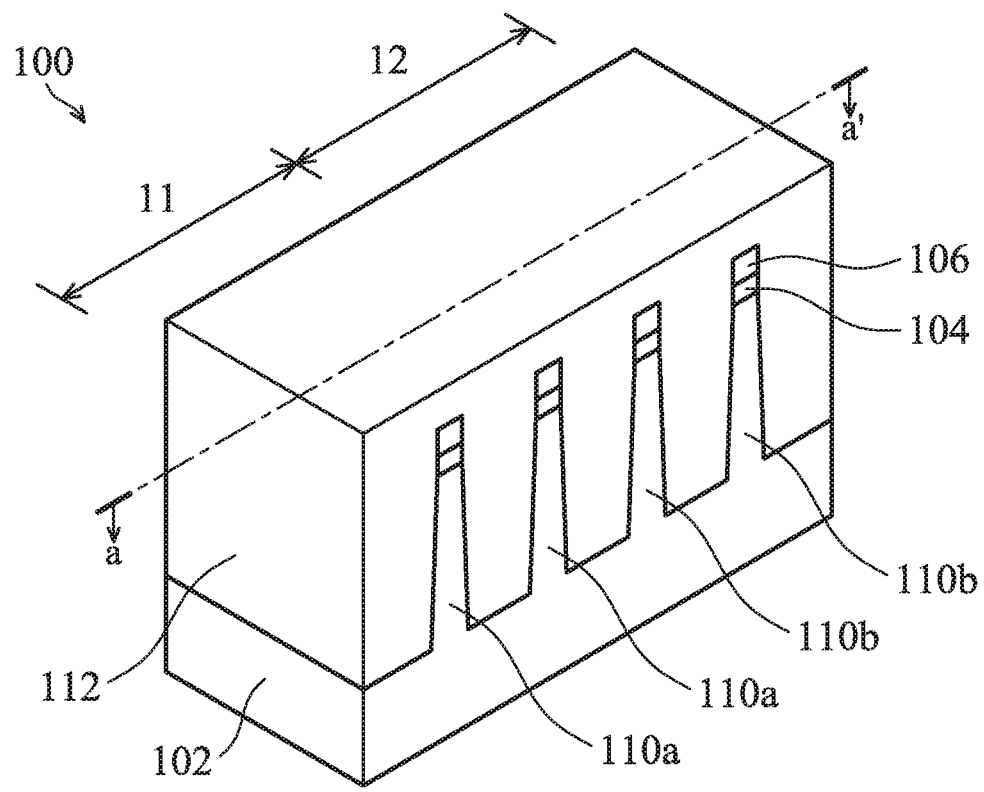
Figure 2C:
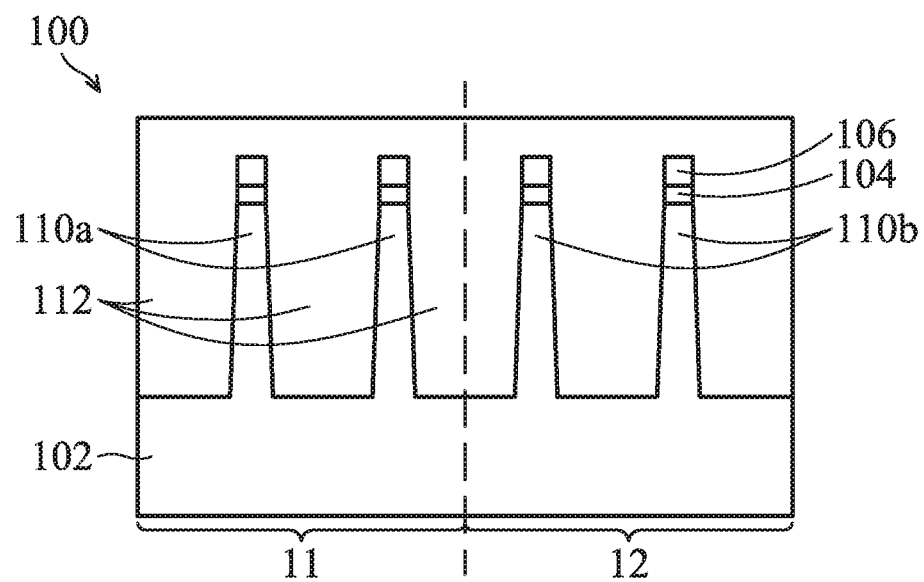

As shown in FIGS. 1C and 2C, after the fin structures 110a, 110b are formed, the isolation layer 112 is formed to cover the fin structures 110a, 110b over the substrate 102, in accordance with some embodiments.

In some embodiments, the isolation layer 112 is made of silicon oxide, silicon nitride, silicon oxynitride, fluoride-doped silicate glass (FSG), or another low-k dielectric material. The isolation layer 112 may be deposited by a deposition process, such as a chemical vapor deposition (CVD) process, a spin-on-glass process, or another applicable process.

Figure 1D:
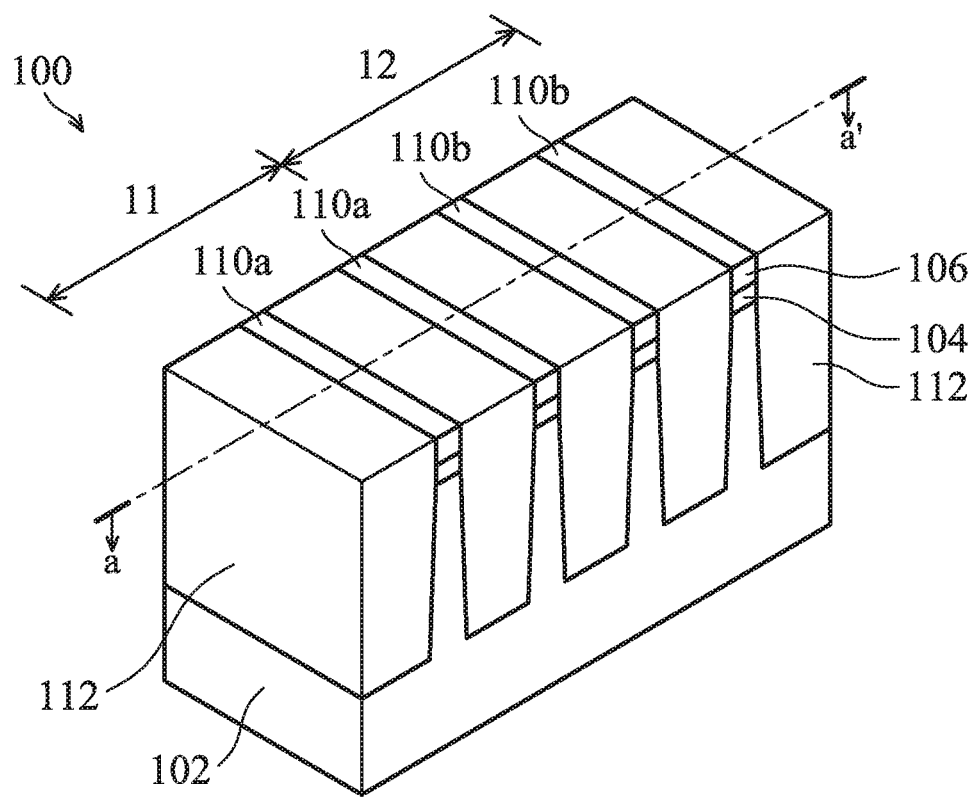
Figure 2D:
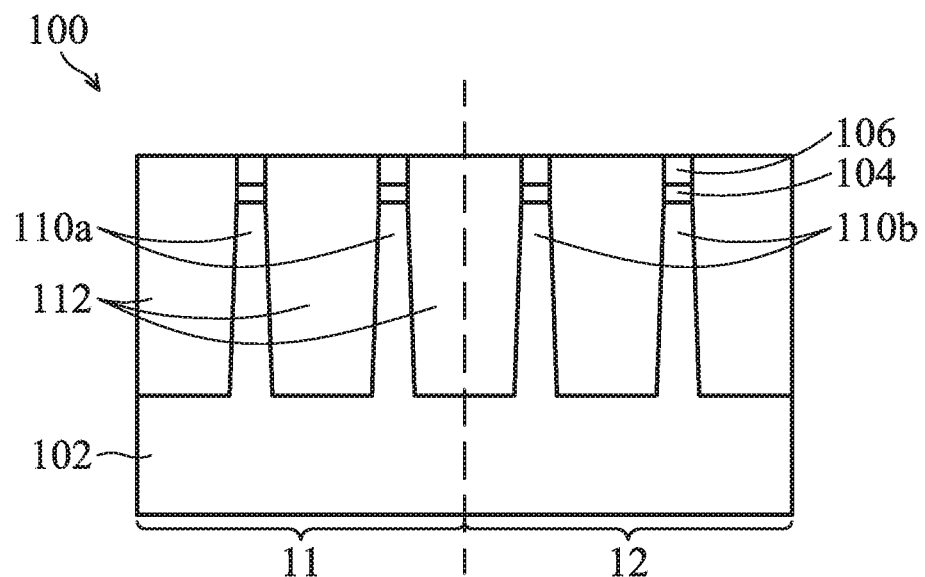

Afterwards, as shown in FIGS. 1D and 2D, the isolation layer 112 is thinned or planarized to expose the top surface of the patterned mask layer 106. In some embodiments, the insulating layer 112 is thinned by a chemical mechanical polishing (CMP) process.

Figure 1E:
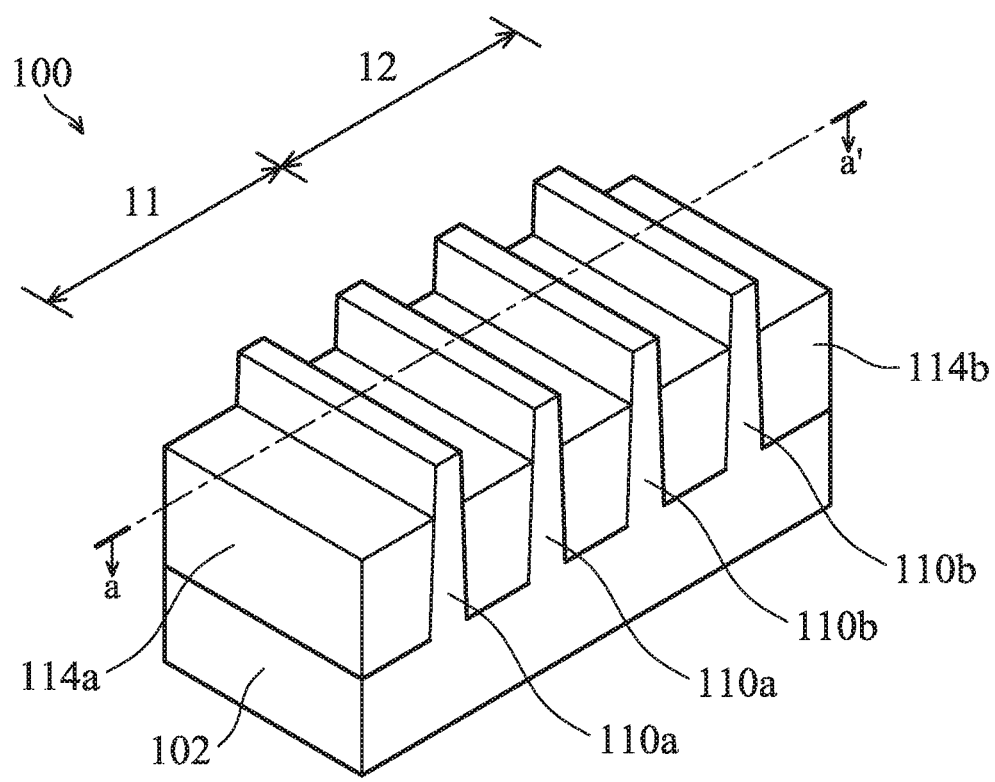
Figure 2E:
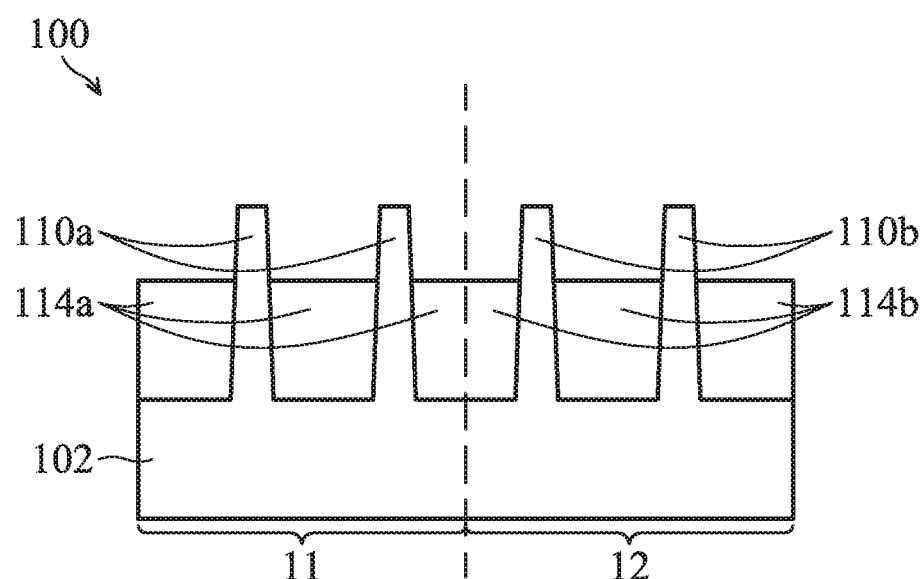

Afterwards, as shown in FIGS. 1E and 2E, a portion of the insulating layer 112 is removed to form a number of isolation structures 114a, 114b, in accordance with some embodiments. In addition, the patterned dielectric layer 104 and the patterned mask layer 106 are removed. The isolation structures 114a, 114b include first isolation structures 114a over the first region 11 and second isolation structures 114b over the second region 12. The isolation structures 114a, 114b may be a shallow trench isolation (STI) structure surrounding the fin structures 110a, 110b.

A lower portion of each of the fin structures 110a, 110b is surrounded by each of the isolation structures 114a, 114b, and an upper portion of each of the fin structures 110a, 110b protrudes from each of the isolation structures 114a, 114b. In other words, a portion of each of the fin structures 110a, 110b is embedded in each of the isolation structures 114a, 114b. The isolation structures 114a, 114b prevent electrical interference or crosstalk.

Figure 1F:
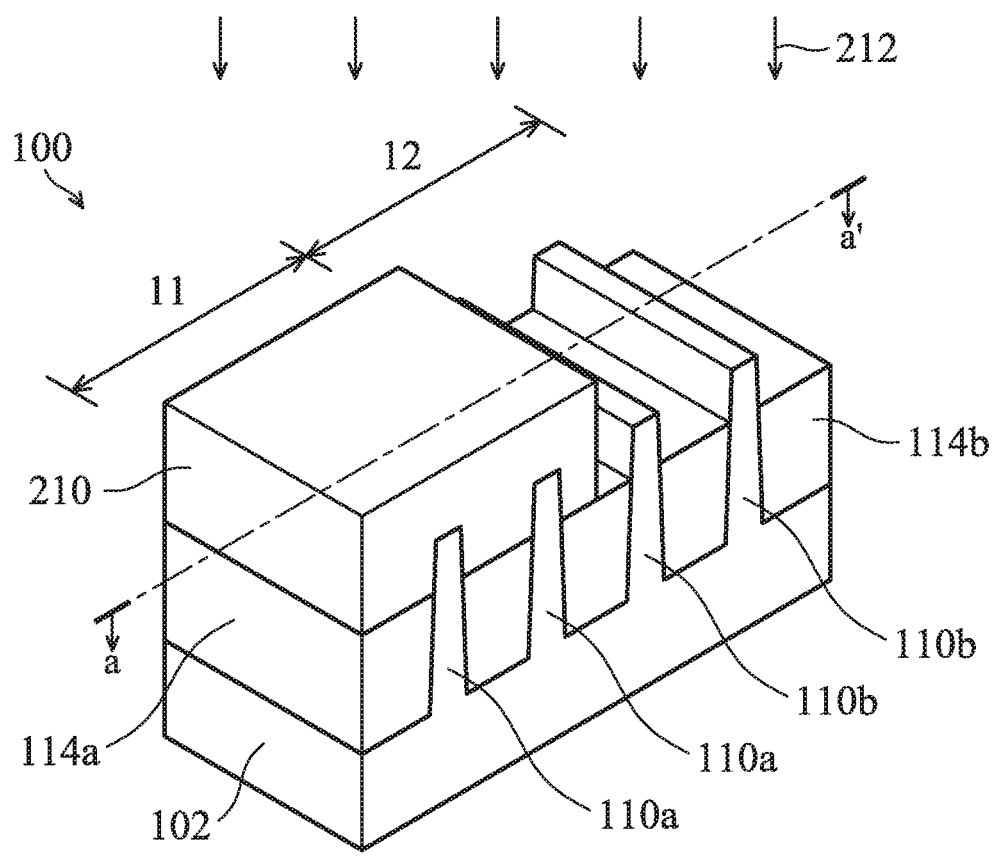
Figure 2F:
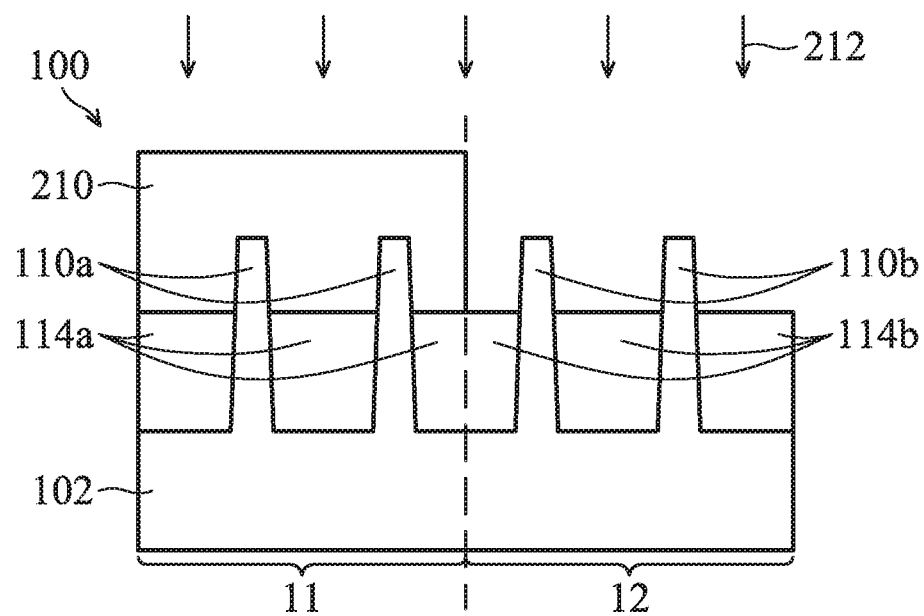

Afterwards, as shown in FIGS. 1F and 2F, a mask layer 210 is formed over the first fin structures 110a and the first isolation structures 114a, and a portion of the second isolation structures 114b is removed, in accordance with some embodiments. In some embodiments, an etching process 212 is performed on the second isolation structures 114b to remove the portion of the second isolation structures 114b.

The mask layer 210 covers the first isolation structures 114a, but the second isolation structures 114b are exposed. In some embodiments, the mask layer 210 is made of photoresist materials, such as polybenzoxazole (PBO), SU-8-photo-sensitive epoxy, film type polymer materials and/or the like.

Figure 1G:
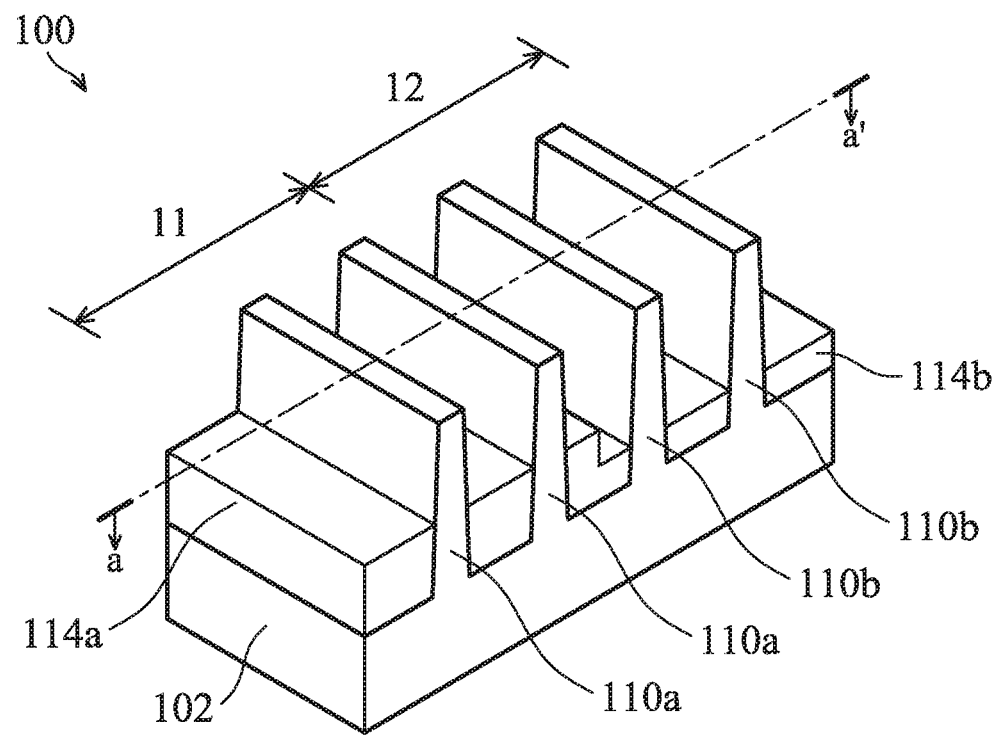
Figure 2G:
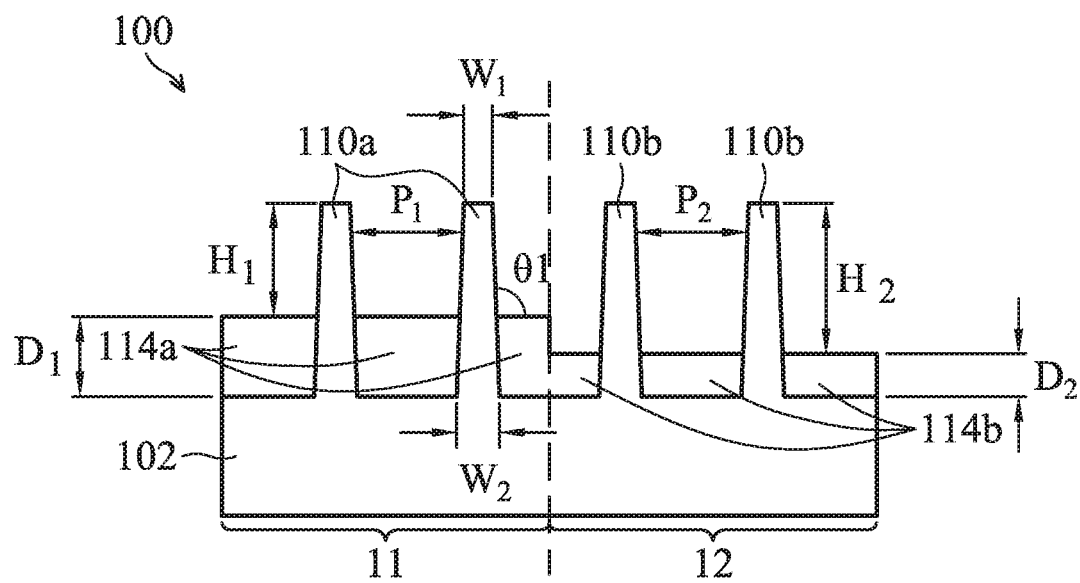

Next, as shown in FIGS. 1G and 2G, after the etching process 212, the mask layer 210 is removed, in accordance with some embodiments. As a result, a top surface of each of the first isolation structures 114a is higher than a top surface of each of the second isolation structures 114b. In other words, the top surface of each of the second isolation structures 114b is lower than the top surface of each of the first isolation structures 114a.

Each of the first fin structures 110a has a first fin height $H_1$ measured from a top surface of each of the first fin structures 110a to a top surface of each of the first isolation structures 114a. Each of the second fin structures 110b has a second fin height $H_2$ measured from a top surface of each of the second fin structures 110b to a top surface of each of the second isolation structures 110b. The first fin height $H_1$ is smaller than the second fin height $H_2$. In some embodiments, the first fin height $H_1$ is in a range from about 40 nm to about 60 nm. In some embodiments, the second fin height $H_2$ is in a range from about 40.1 nm to about 80 nm. The higher difference $\Delta H$ between the first fin height $H_1$ and the second fin height $H_2$ is in a range from about 0.1 nm to about 20 nm.

Each of the first isolation structures 114a has a first depth $D_1$, and each of the second isolation structures 114b has a second depth $D_2$. In some embodiments, the first depth $D_1$ of each of the first isolation structures 114a is greater than the second depth $D_2$ of each of the second isolation structures 114b.

In the first region 11, a first pitch $P_1$ is between two adjacent first fin structures 110a, and a second pitch $P_2$ is between two adjacent second fin structures 110b. In some embodiments, the first pitch $P_1$ is in a range from about 20 nm to about 60 nm. In some embodiments, the second pitch $P_2$ is in n a range from about 20 nm to about 60 nm.

As shown in FIG. 2G, a first angle θ1 between the sidewall surface of each of the fin structures 110a, 110b and the top surface of each of the isolation structures 114a, 114b. In some embodiments, the first angle θ1 is in a range from about 95 degrees to about 120 degrees. Each of the first structures 110a has a top width $W_1$ and a bottom width $W_2$, and the top width $W_1$ is smaller than the bottom width $W_2$.

Figure 1H:
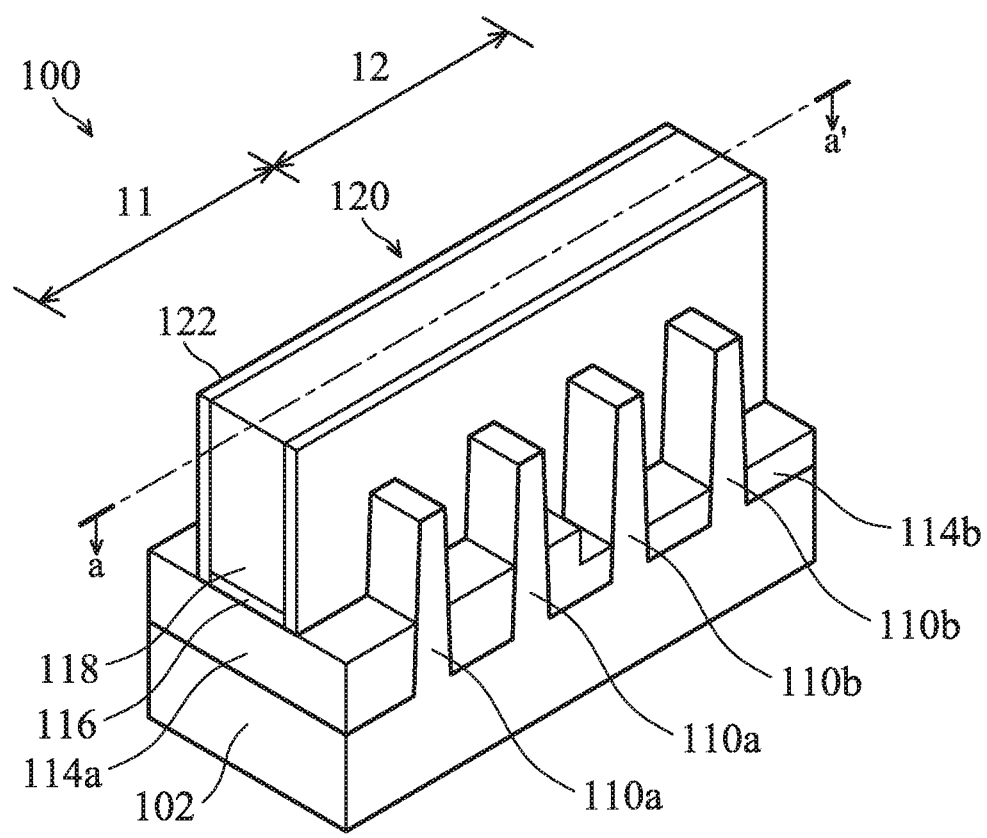
Figure 2H:
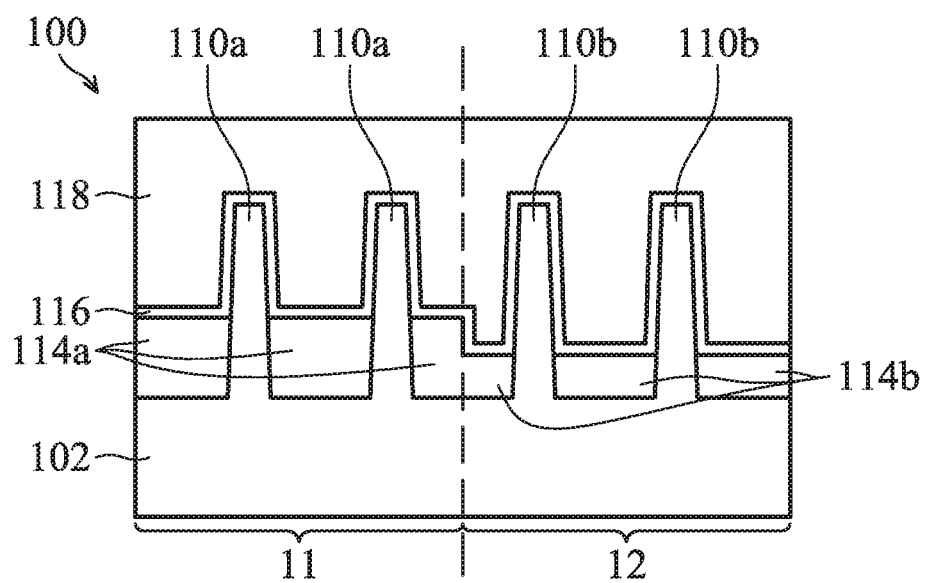

Afterwards, as shown in FIGS. 1H and 2H, a gate dielectric layer 116 is formed on the fin structures 110a, 110b, the isolation structures 114a, 114b, and a gate electrode layer 118 is formed on the gate dielectric layer 116, in accordance with some embodiments. A gate structure 120 is constructed by the gate dielectric layer 116 and the gate electrode layer 118. In some embodiments, the gate dielectric layer 116 is a dummy gate dielectric layer and the gate electrode layer 118 is a dummy gate electrode layer. The dummy gate dielectric layer and the dummy gate electrode layer may be replaced by the following steps to form a real gate structure with a high-k dielectric layer and a metal gate electrode layer.

In some embodiments, the gate dielectric layer 116 may include dielectric materials, such as silicon oxide, silicon nitride, silicon oxynitride, dielectric material(s) with high dielectric constant (high-k), or combinations thereof. In some embodiments, the gate electrode layer 118 is made of polysilicon. The gate dielectric layer 116 and the gate electrode layer 118 are independently formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Afterwards, a pair of spacer layers 122 are formed on opposite sidewalls of the gate structure 120, in accordance with some embodiments. More specifically, the spacer layers 122 are formed on sidewall surfaces of the gate electrode layer 118. The spacer layers 122 may be made of silicon oxide, silicon nitride, silicon oxynitride, and/or dielectric materials. In some embodiments, the spacer layers 122 are formed by a chemical vapor deposition (CVD) process, a spin-on-glass process, or another applicable process.

Afterwards, a top portion of the fin structures 110a, 110b is removed to form a recess (not shown), and the source/drain (S/D) structures (not shown) are formed in the recess. The source/drain (S/D) structures are formed on opposite of the gate structure 120. In some embodiments, the S/D structures are strained source/drain structures. In some embodiments, the S/D structures are formed by growing a strained material in the recesses of the fin structures 110a, 110b by an epitaxial (epi) process. In addition, the lattice constant of the strained material may be different from the lattice constant of the substrate 102.

In some embodiments, the source/drain structures include Ge, SiGe, InAs, InGaAs, InSb, GaAs, GaSb, InAlP, InP, or a combination thereof. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, or other suitable epi processes.

In some embodiments, after the S/D structures are formed, a contact etch stop layer (CESL) (not shown) is formed on the S/D structures and the gate structure 120. In some embodiments, the contact etch stop layer is made of silicon nitride, silicon oxynitride, and/or other applicable materials. The contact etch stop layer may be formed by plasma enhanced CVD, low pressure CVD, ALD, or other applicable processes.

Figure 1I:
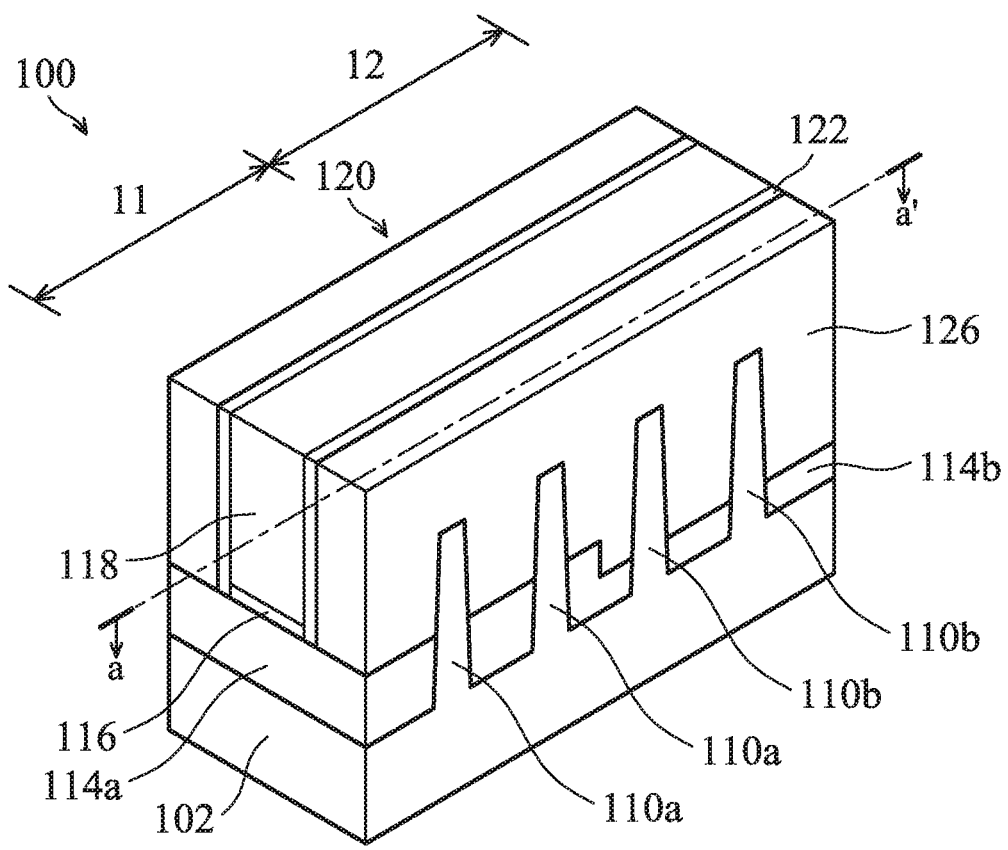
Figure 2I:
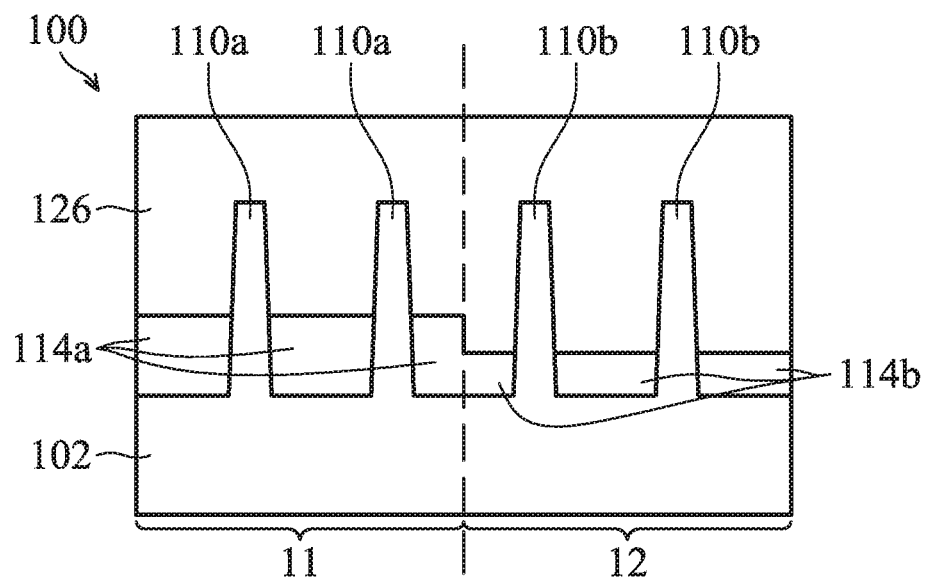

Afterwards, as shown in FIGS. 1I and 2I, an inter-layer dielectric (ILD) material is formed over the fin structures 110a, 110b over the substrate 102, in accordance with some embodiments. Next, the ILD material is planarized to form the ILD structure 126.

The ILD structure 126 has a first portion in the first region 11 and a second portion in the second region 12. A bottom surface of the first portion of the ILD structure 126 is higher than a bottom surface of the second portion of the ILD structure 126. The ILD structure 126 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 126 may be formed by chemical vapor deposition (CVD), physical vapor deposition, (PVD), atomic layer deposition (ALD), spin-on coating, or other applicable processes.

Afterwards, the dummy gate dielectric layer 116 and the dummy gate electrode layer 118 are removed to form a trench, and the real gate dielectric layer and metal gate electrode layer (not shown) are filled into the trench. In some embodiments, a work function layer (not shown) may be formed between the gate dielectric layer and the gate electrode layer. The work function layer (not shown) is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Afterwards, the FinFET device structure 200 continues to form other devices or structures.

In the first embodiment, the FinFET device structure 100 with different fin heights is obtained by performing two etching processes. The first etching process is performed to simultaneously remove a portion of the first isolation structures 114a and a portion of the second isolation structures 114b. The second etching process with an extra mask layer is used to further remove the second isolation structures 114b to a predetermined depth. Compared with forming the second isolation structure by using one etching process, the etching amount is controlled more precisely by the two etching process. Especially when the FinFET device structure has a fine spacing (or smaller pitch), which is in the range of nanometers (nm), between neighboring gate structures, removal of the bottom portion of the second isolation structures 114b becomes difficult due to the shadow effect. In order to control the fin height more precisely, the second isolation structures 114b are etched by a first rough etching process and a second accurate etching process. In addition, the second etching process is compatible with the FinFET processes.

Furthermore, the FinFET device structure 100 with different fin heights can improve the cutoff frequency (Ft), and therefore the FinFET device structure 100 can be used in the high-frequency device.

FIGS. 3A-3H show perspective representations of various stages of forming a FinFET device structure 200, in accordance with some embodiments of the disclosure. FIGS. 4A-4H show cross-sectional representations of various stages of forming the FinFET device structure 200 shown in FIGS. 3A-3H. FIGS. 4A-4H show cross-sectional representations taken along line aa' in FIGS. 3A-3H. Some processes and materials used to form the FinFET device structure 200 are similar to, or the same as, those used to form the FinFET structure 100 and are not repeated herein.

Figure 3A:
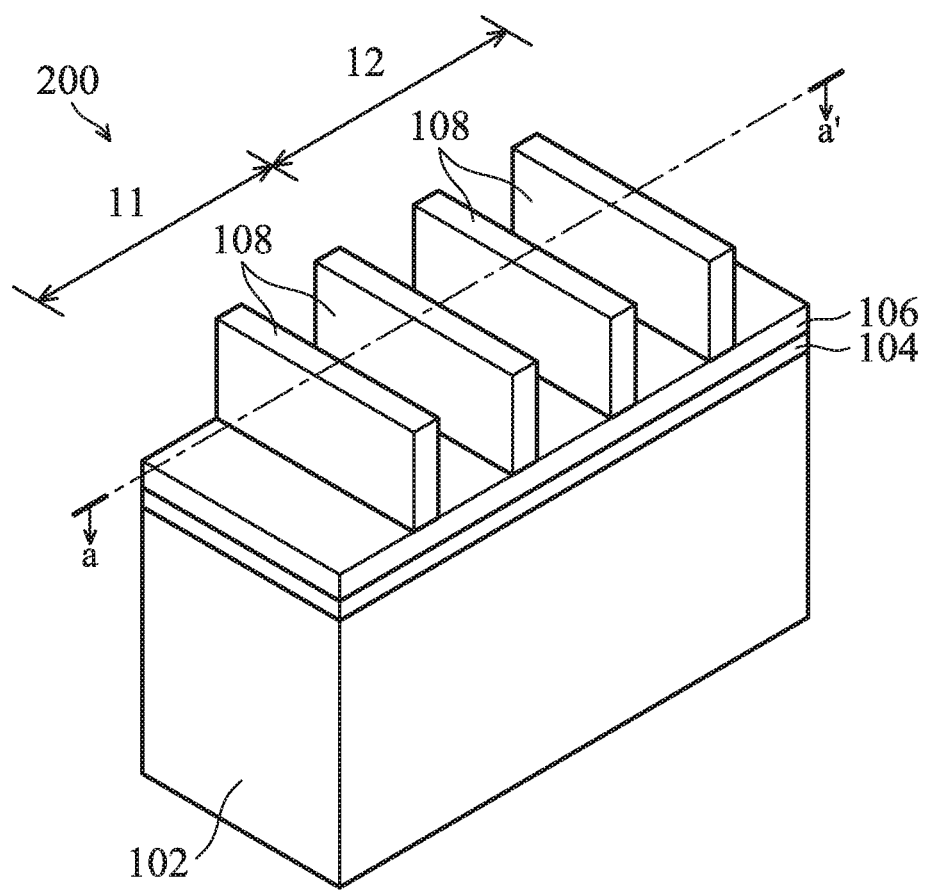
FIGS. 3A-3H show perspective representations of various stages of forming a FinFET device structure, in accordance with some embodiments of the disclosure.
Figure 4A:
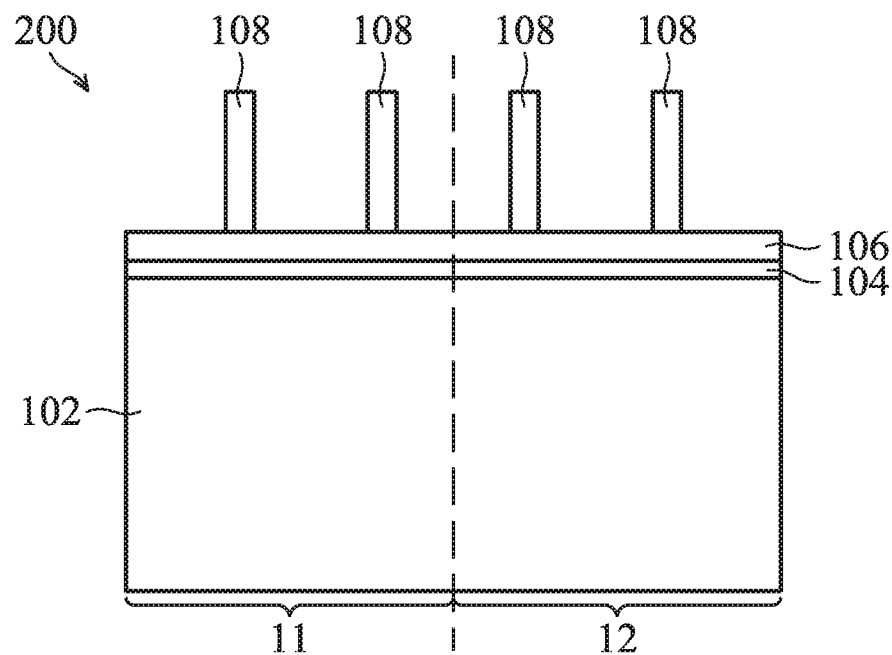
FIGS. 4A-4H show cross-sectional representations of various stages of forming the FinFET device structure shown in FIGS. 3A-3H.
Figure 3B:
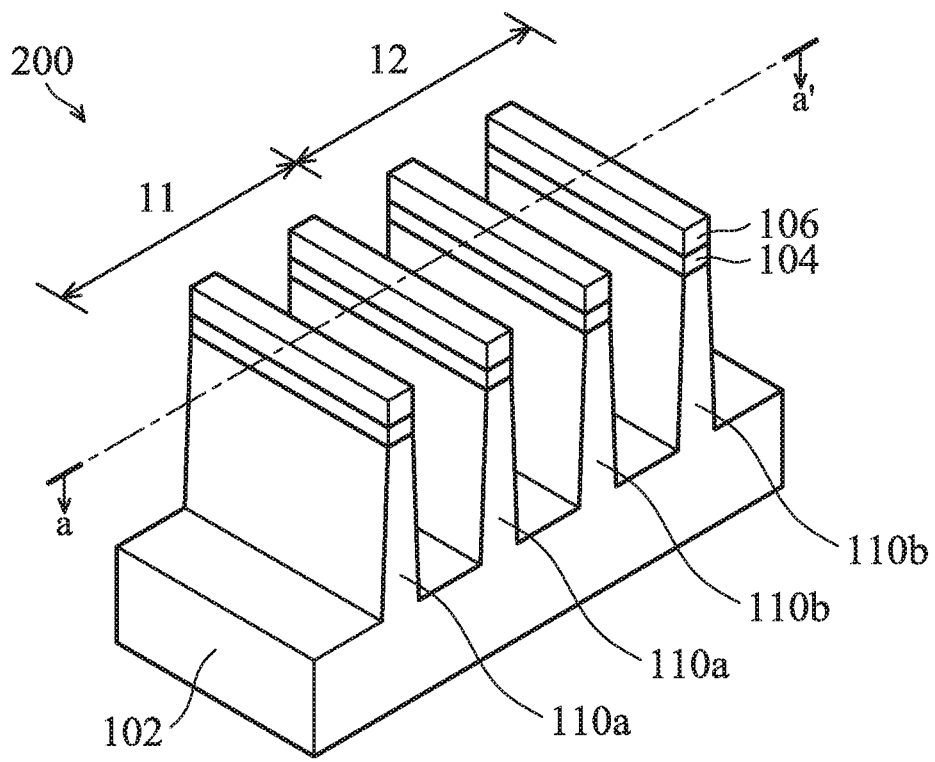
Figure 4B:
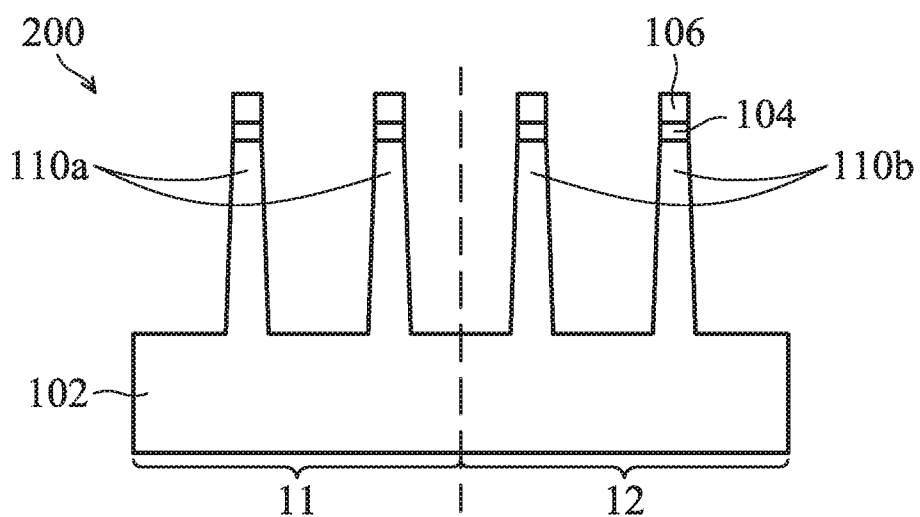

The structures in FIGS. 3A-3B are similar to the structures in FIGS. 1A-1B and the structures in FIGS. 4A-4B are similar to the structures in FIGS. 2A-2B, and are not repeated herein.

Figure 3C:
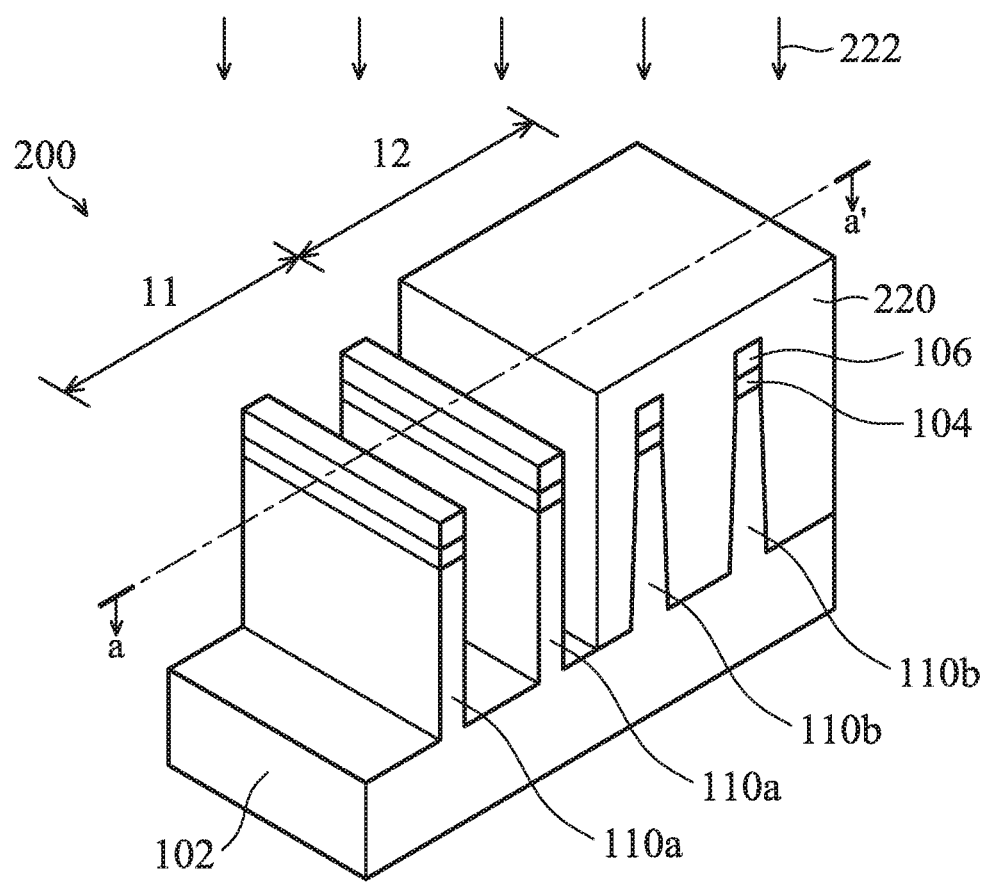
Figure 4C:
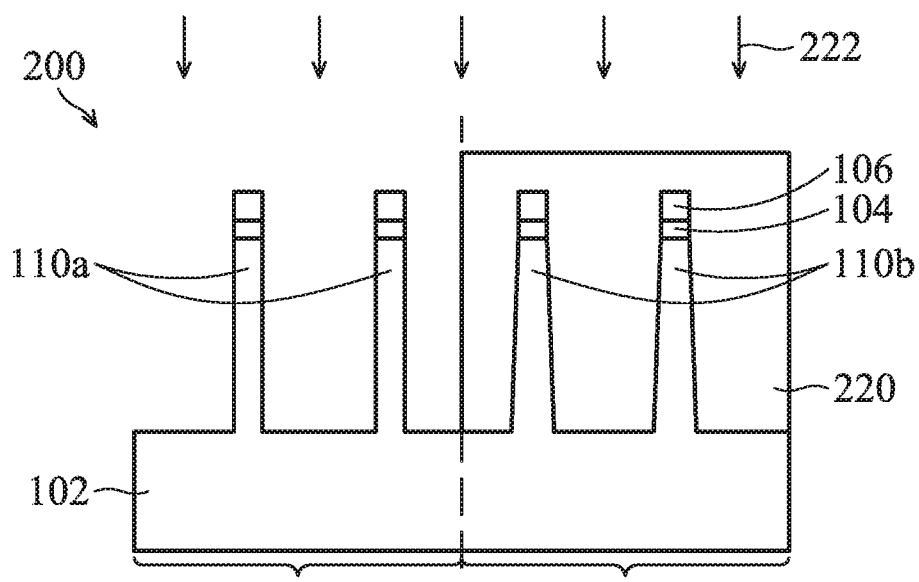

Afterwards, as shown in FIGS. 3C and 4C, a mask layer 220 is formed over the second fin structures 110b in the second region 12, and a portion of the first fin structures 110 is removed, in accordance with some embodiments. An etching process 222 is performed on the first fin structures 110 over the first region 11 to remove or shape a portion of the first fin structures 110a. In some embodiments, the etching process 222 is a dry etching process with etching gas, such as $Cl_2$, HB, $CF_4$ or another applicable gas. Each of the first fin structures 110a has a constant width from a bottom portion to a top portion.

Figure 3D:
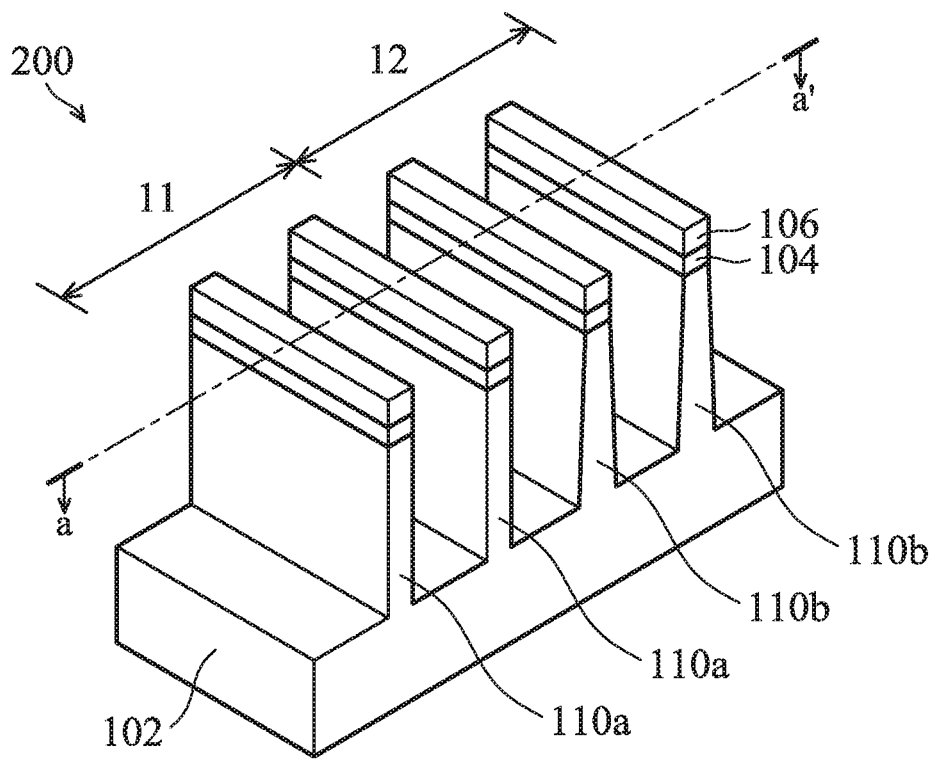
Figure 4D:
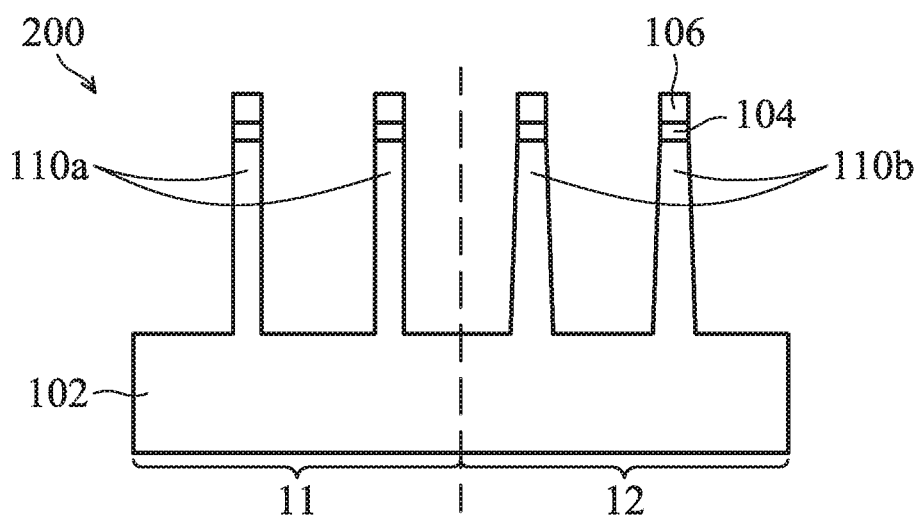

Next, as shown in FIGS. 3D and 4D, after the etching process 222, the mask layer 220 is removed, in accordance with some embodiments. The mask layer 220 may be removed by a dry etching process or a wet etching process.

The first fin structures 110a in the first region 11 and the second fin structures 110b in the second region 12 have different fin profiles. The first fin structures 110a are etching twice and have straighter sidewall surface when compared with the second fin structures 110b.

Figure 3E:
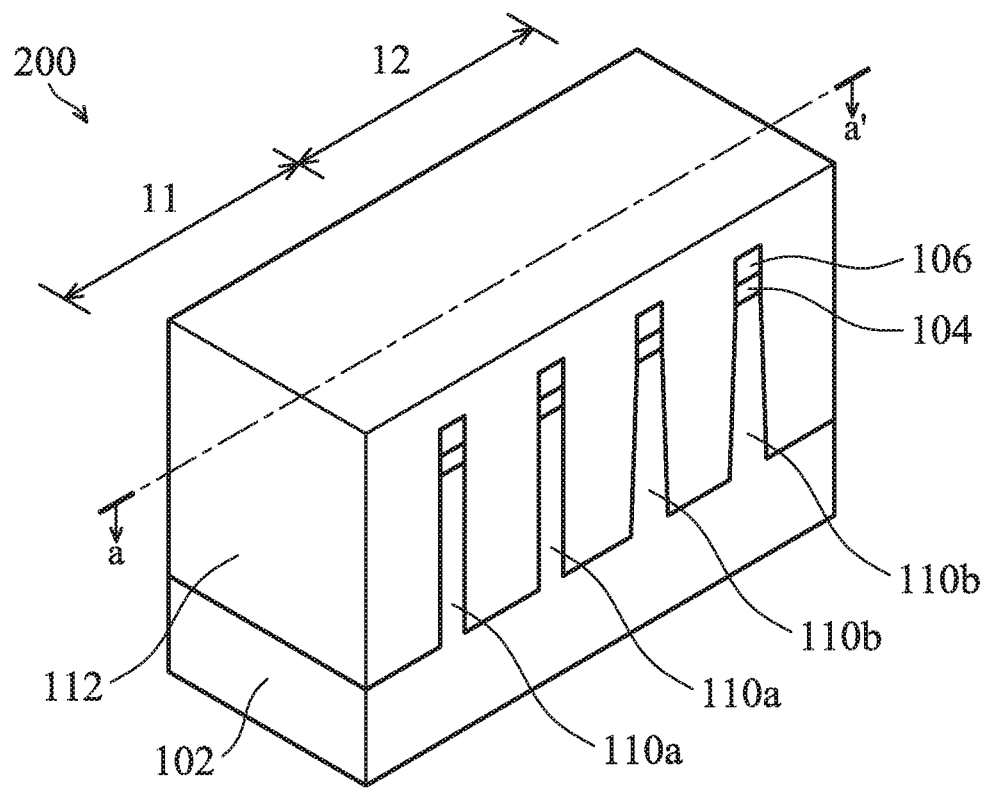
Figure 4E:
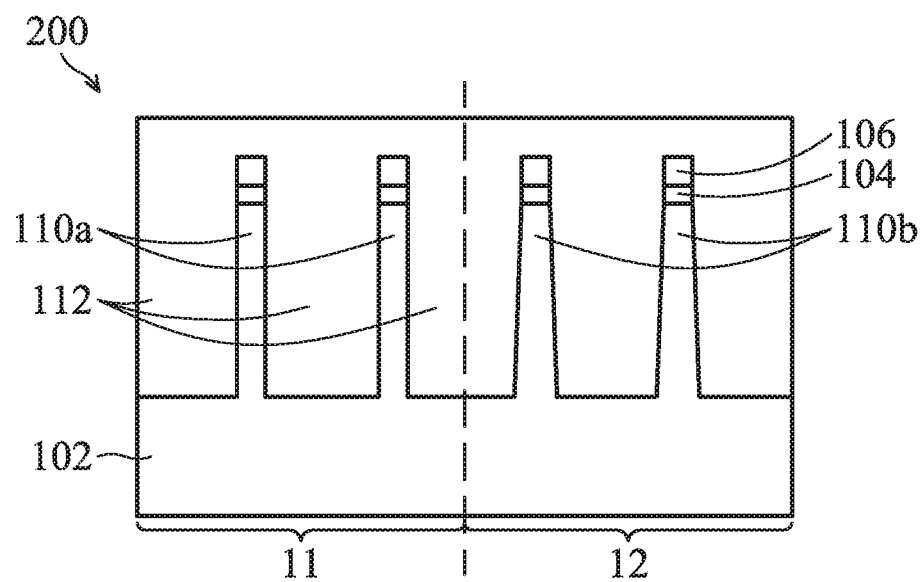

Afterwards, as shown in FIGS. 3E and 4E, the isolation layer 112 is formed to cover the fin structures 110a, 110b over the substrate 102, in accordance with some embodiments.

Figure 3F:
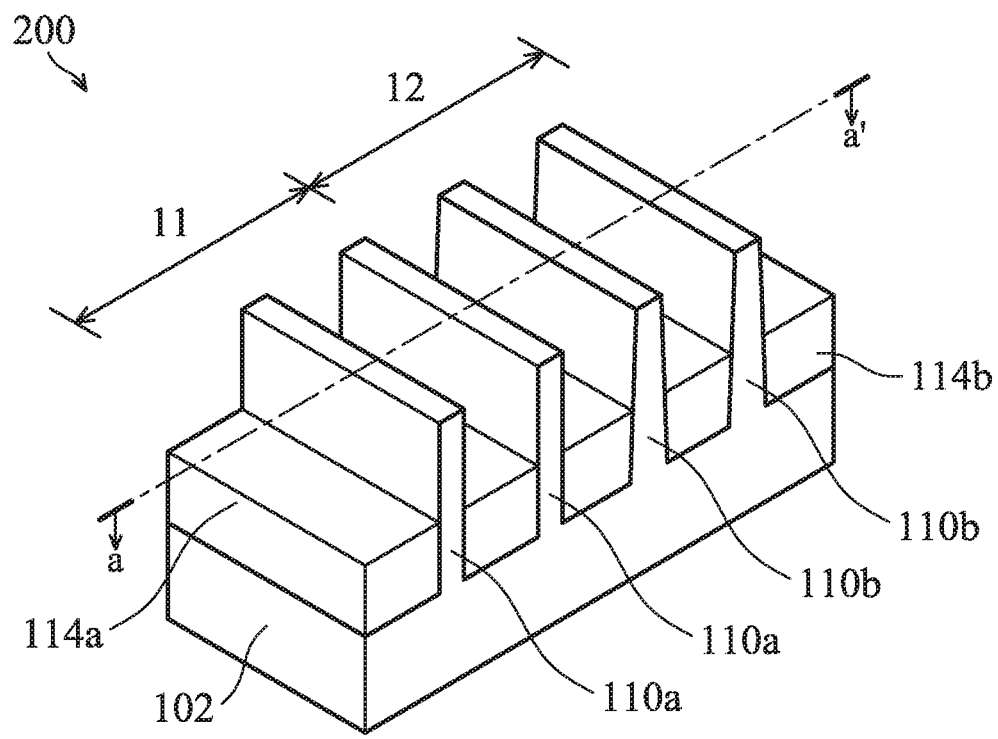
Figure 4F:
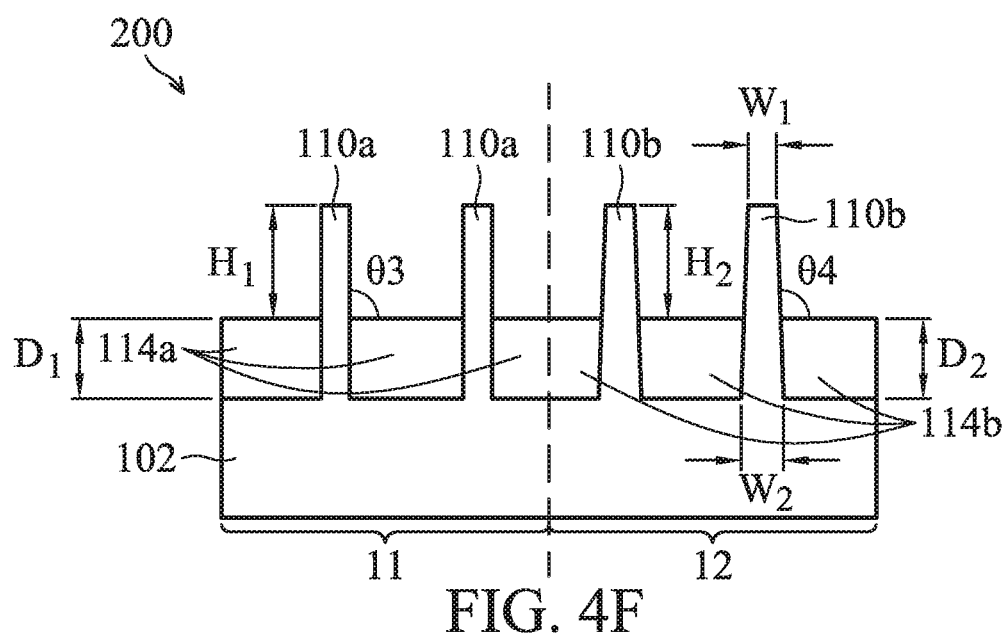

Afterwards, as shown in FIGS. 3F and 4F, the isolation layer 112 is thinned or planarized, and then is etched to form the first isolation structures 114a and the second isolation structures 114b, in accordance with some embodiments. As a result, the first fin structures 110a are surrounded by the first isolation structures 114a, and the second fin structures 110b are surrounded by the second isolation structures 114b.

Each of the first fin structures 110a has a first fin height $H_1$, and each of the second fin structures 110b has a second fin height $H_2$. In some embodiments, the first fin height $H_1$ is equal to the second fin height $H_2$. Each of the second structures 110b has a top width $W_1$ and a bottom width $W_2$, and the top width $W_1$ is smaller than the bottom width $W_2$. Each of the first fin structures 110a has a constant width from a bottom portion to a top portion.

A third angle $\theta_3$ is between the sidewall surface of each of the first fin structures 110a and the top surface of the first isolation structures 114a. The sidewall surface of each of the first fin structures 110 is substantially orthogonal to the top surface of each of the first isolation structures 114a. A fourth angle $\theta_4$ is between the sidewall surface of each of the second fin structures 110b and the top surface of the second isolation structures 114b. In some embodiments, the third angle $\theta_3$ is smaller than the fourth angle $\theta_4$. In some embodiments, the third angle $\theta_3$ is in a range from about 80 degrees to about 90 degrees. In some embodiments, the fourth angle $\theta_4$ is in a range from about 80 degrees to about 120 degrees. The angle difference between the third angle $\theta_3$ and the fourth angle $\theta_4$ is in a range from about 0 degree to about 30 degrees.

Figure 3G:
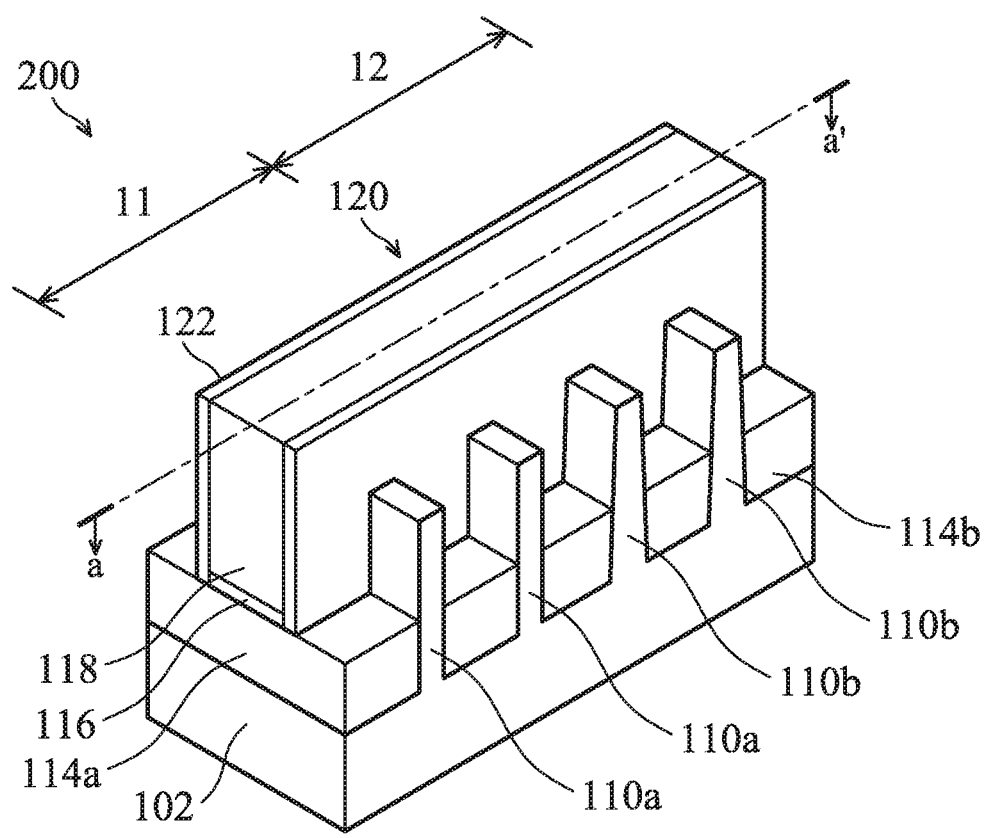
Figure 4G:
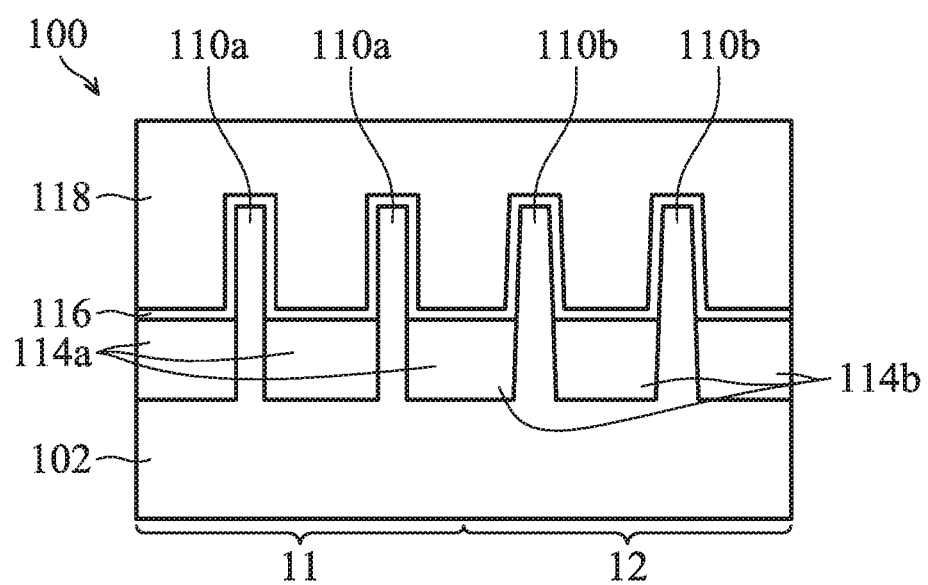

Next, as shown in FIGS. 3G and 4G, the gate structure 120 is formed on the fin structures 110a, 110b, the isolation structures 114a, 114b, in accordance with some embodiments. The gate structure 120 includes the gate dielectric layer 116 and the gate electrode layer 118. Afterwards, a pair of spacer layers 122 are formed on opposite sidewalls of the gate structure 120.

Figure 3H:
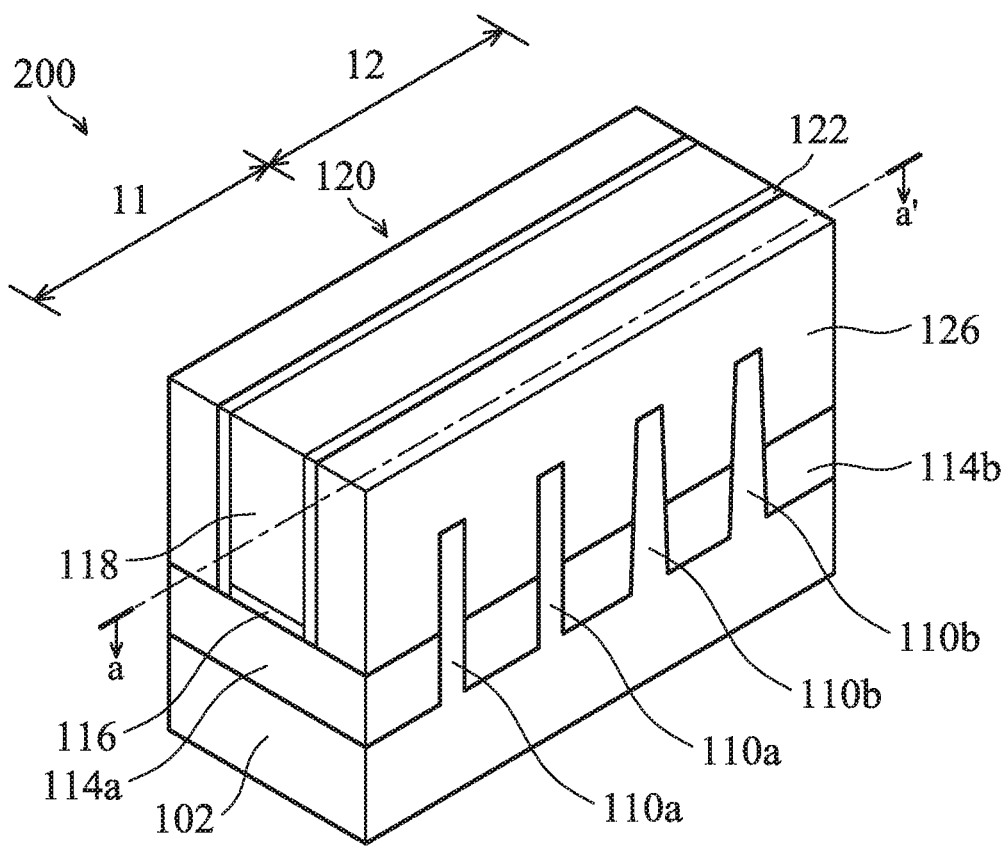
Figure 4H:
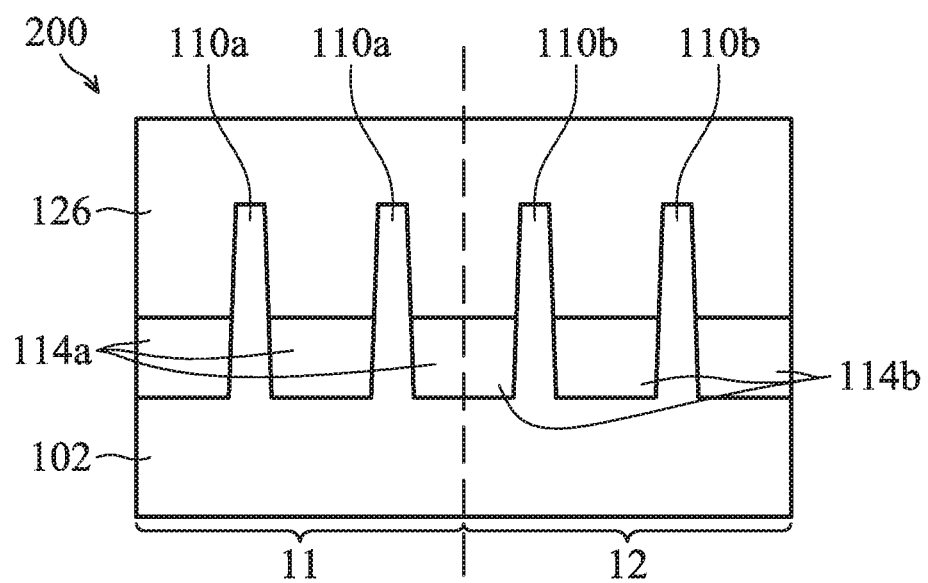

Afterwards, as shown in FIGS. 3H and 4H, the ILD structure 126 is formed on the fin structures 110a, 110b and the isolation structures 114a, 114b, in accordance with some embodiments. Afterwards, the FinFET device structure 200 continues to form other devices or structures.

In the second embodiment, the FinFET device structure 200 is formed to have different fin profiles. The first fin structures 110a in the first region 11 have straighter sidewall surfaces, and the second fin structures 110b in the second region 12 have sloped sidewall surfaces. By forming different fin profiles, the parasite capacitance (C) of the FinFET device structures 200 is reduced, and therefore the cutoff frequency (Ft) of FinFET device structure 200 is improved. Therefore, the FinFET device structure 200 can be used in the high-frequency device.

FIGS. 5A-5E show perspective representations of various stages of forming a FinFET device structure 300, in accordance with some embodiments of the disclosure. FIGS. 6A-6E show cross-sectional representations of various stages of forming the FinFET device structure 300 shown in FIGS. 5A-5E. FIGS. 6A-6E show cross-sectional representations taken along line aa' in FIGS. 5A-5E. Some processes and materials used to form the FinFET device structure 300 are similar to, or the same as, those used to form the FinFET structure 100 and are not repeated herein.

Figure 5A:
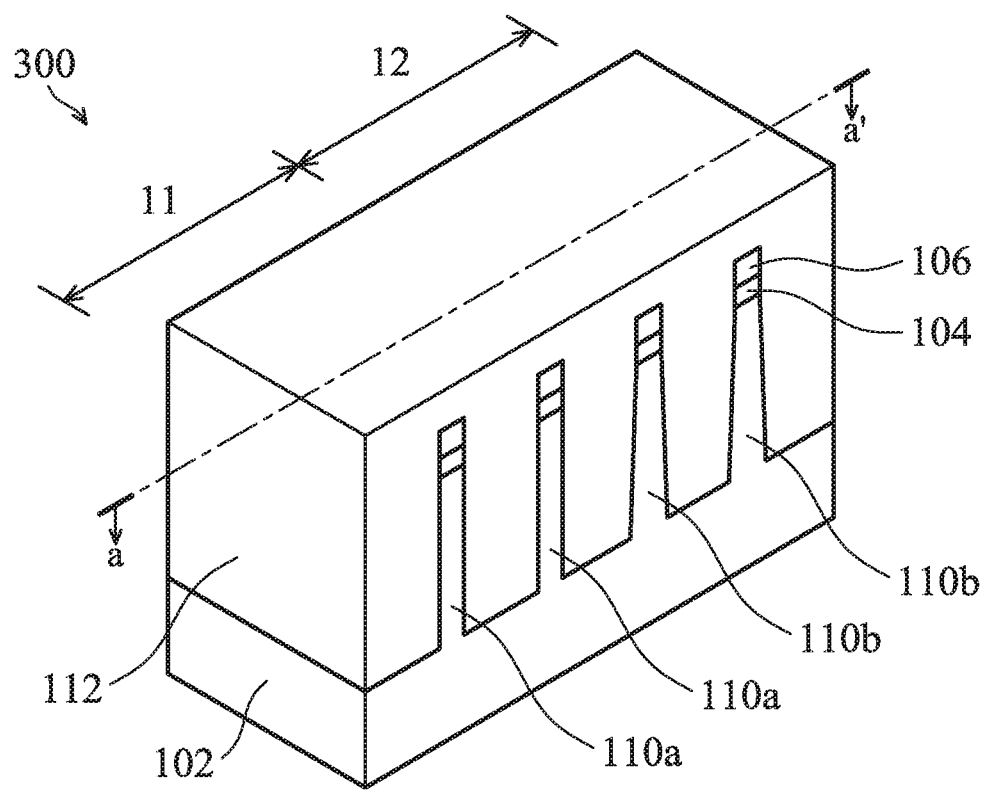
FIGS. 5A-5E show perspective representations of various stages of forming a FinFET device structure, in accordance with some embodiments of the disclosure.
Figure 6A:
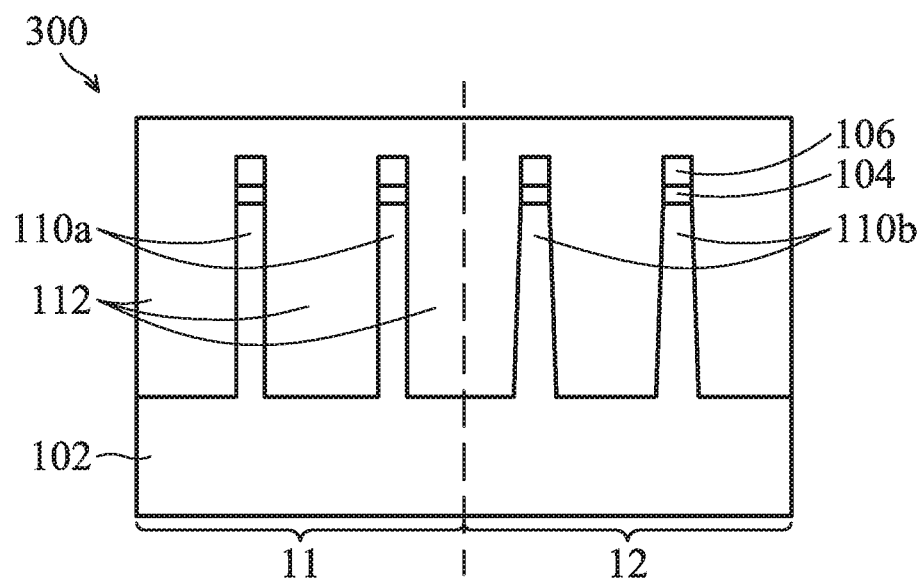
FIGS. 6A-6E show cross-sectional representations of various stages of forming the FinFET device structure shown in FIGS. 5A-5E.

As shown in FIGS. 5A and 6A, after the fin structures 110a, 110b are formed, the isolation layer 112 is formed to cover the fin structures 110a, 110b over the substrate 102, in accordance with some embodiments.

Figure 5B:
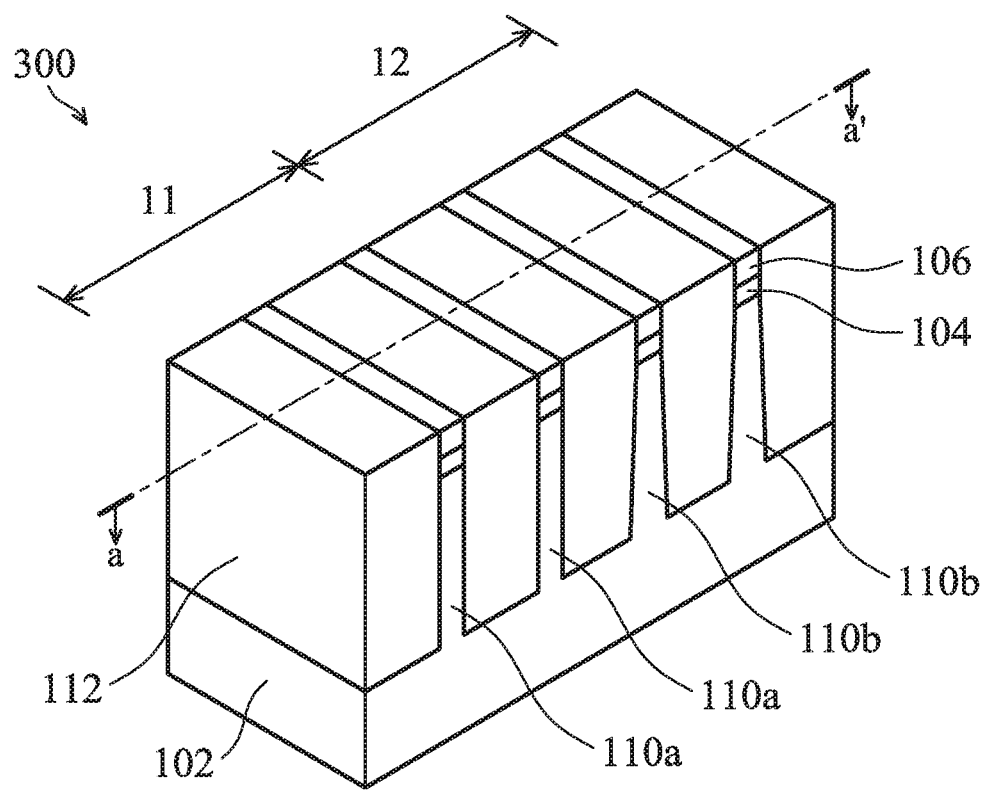
Figure 6B:
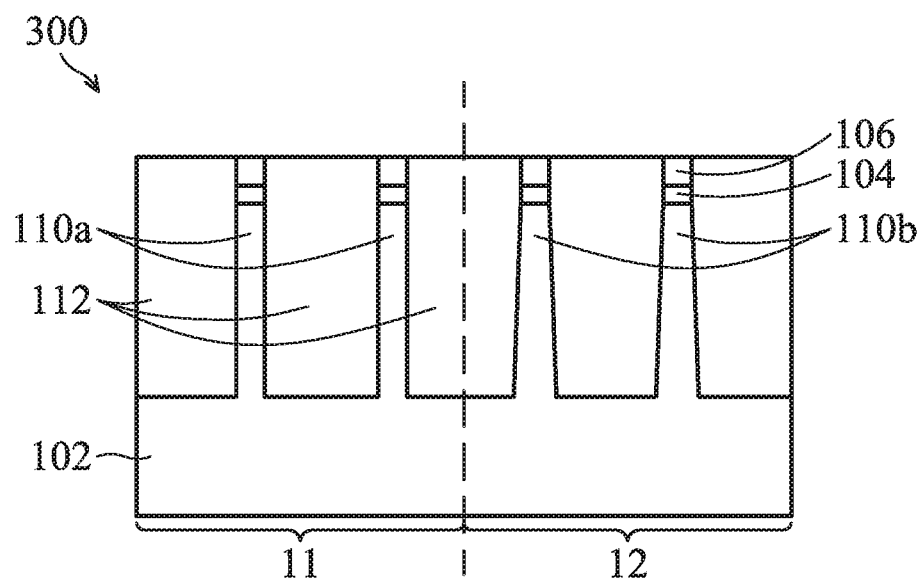

Afterwards, as shown in FIGS. 5B and 6B, the isolation layer 112 is thinned or planarized to expose the top surface of the patterned mask layer 106. In some embodiments, the insulating layer 112 is thinned by a chemical mechanical polishing (CMP) process.

Figure 5C:
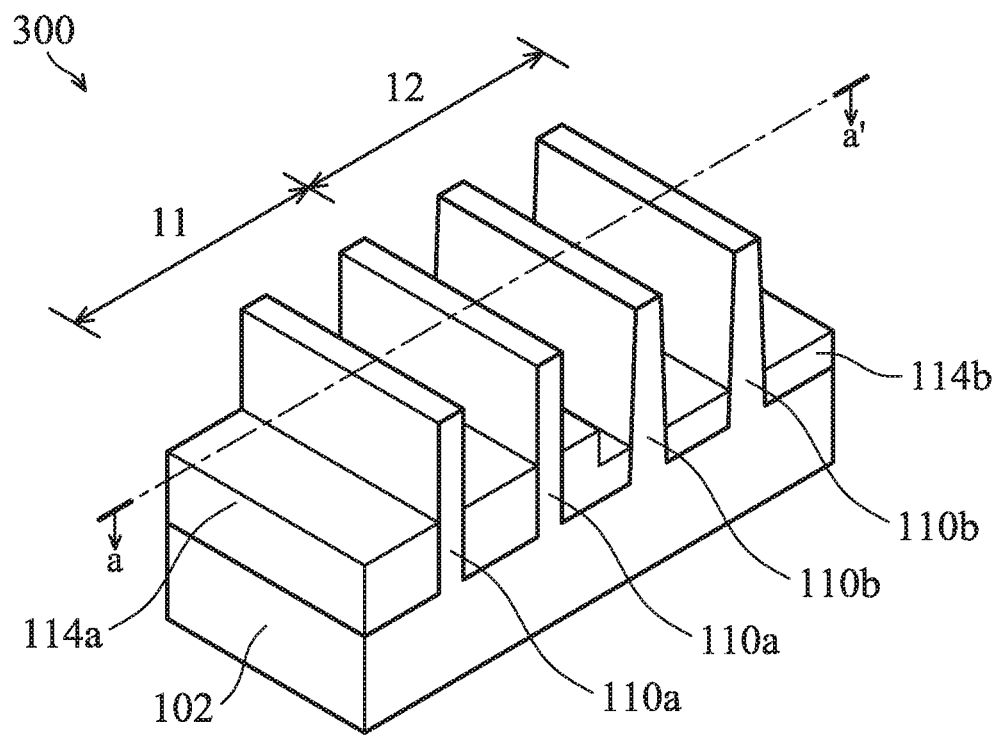
Figure 6C:
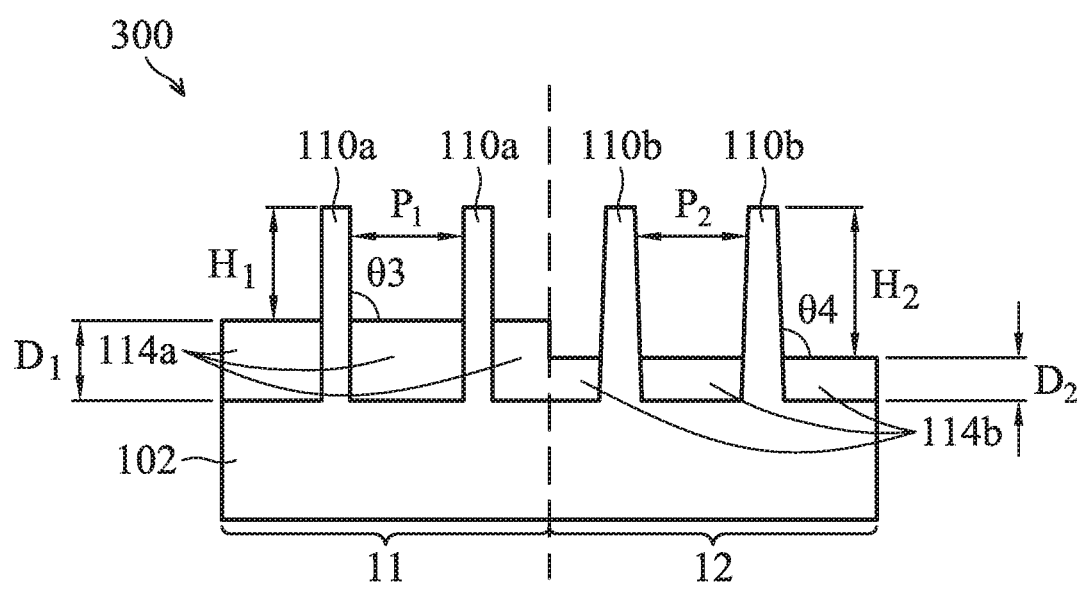

Afterwards, as shown in FIGS. 5C and 6C, a portion of the insulating layer 112 is removed to form a number of isolation structures 114, in accordance with some embodiments. In addition, the patterned dielectric layer 104 and the patterned mask layer 106 are removed. The isolation structures 114 include first isolation structures 114a over the first region 11 and second isolation structures 114b over the second region 12.

It should be noted that the second pitch $P_2$ between two adjacent second fin structures 110b is greater than the first pitch $P_1$ between two adjacent first fin structures 110a due to the second fin structures 110b with a narrower top portion. More of the second isolation structures 114b are removed compared with the first isolation structures 114a since the etching gas may easily pass through the wider opening (or wider pitch $P_2$). The first isolation structures 114a are removed less, such that the top surface of each of the first isolation structures 114a is higher than the top surface of each of the second isolation structures 114b.

The first fin height $H_1$ of each of the first fin structures 110a is smaller than the second fin height $H_2$ of each of the second fin structures 110b. The first depth $D_1$ of each of the first isolation structures 114a is greater than the second depth $D_2$ of each of the second isolation structures 114b. In addition, the third angle $\theta_3$ is smaller than the fourth angle $\theta_4$.

Figure 5D:
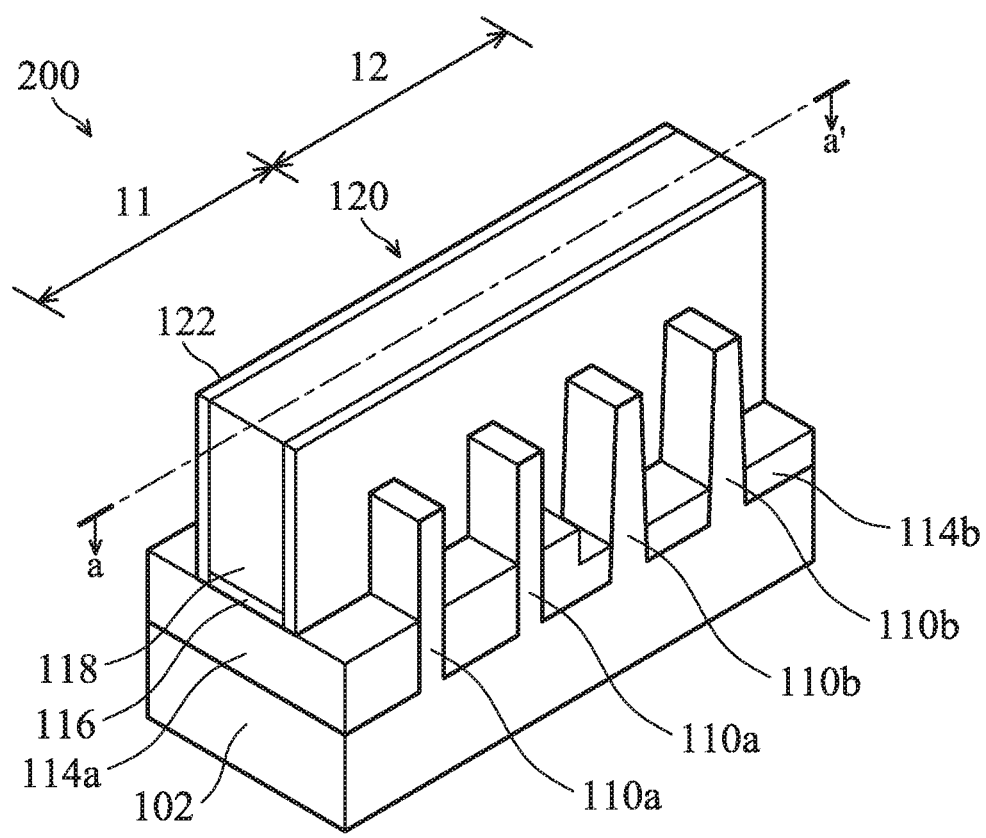
Figure 6D:
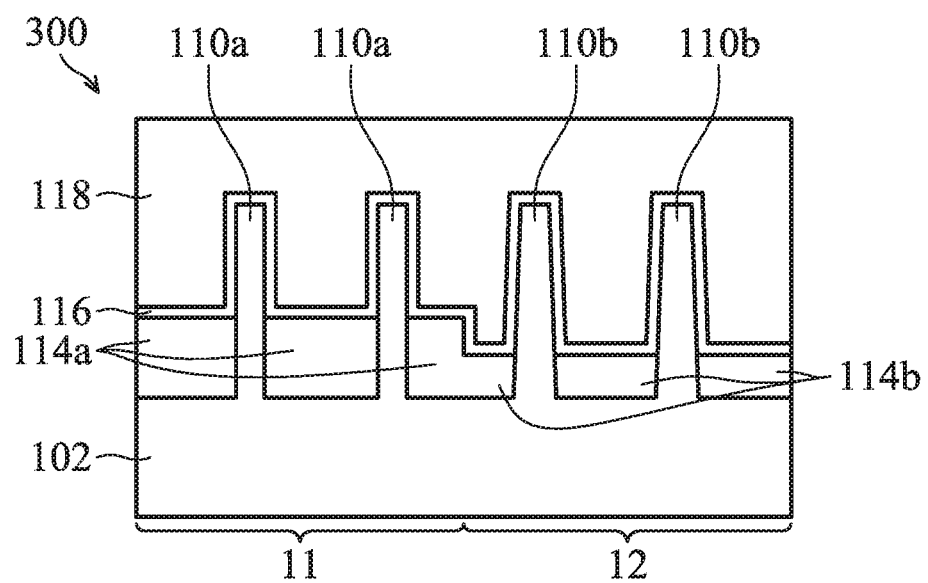

Afterwards, as shown in FIGS. 5D and 6D, the gate structure 120 is formed on the fin structures 110a, 110b, the isolation structures 114a, 114b, in accordance with some embodiments. The gate structure 120 includes the gate dielectric layer 116 and the gate electrode layer 118. Afterwards, a pair of spacer layers 122 are formed on opposite sidewalls of the gate structure 120.

Figure 5E:
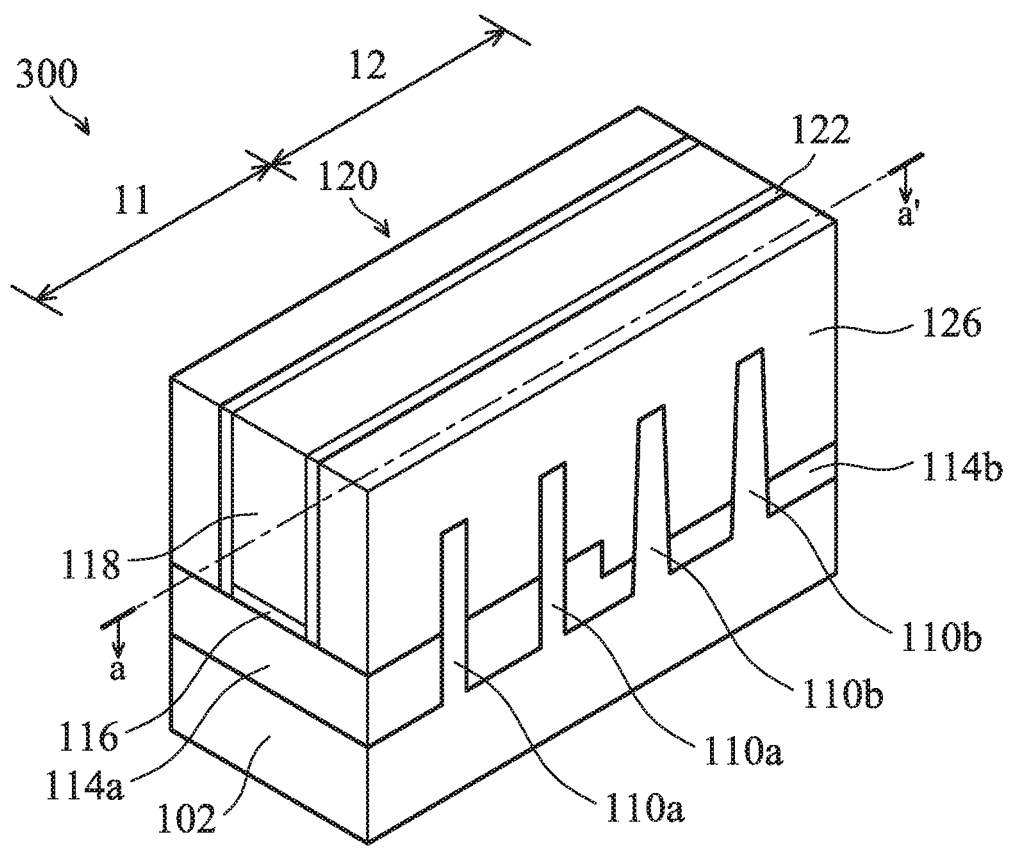
Figure 6E:
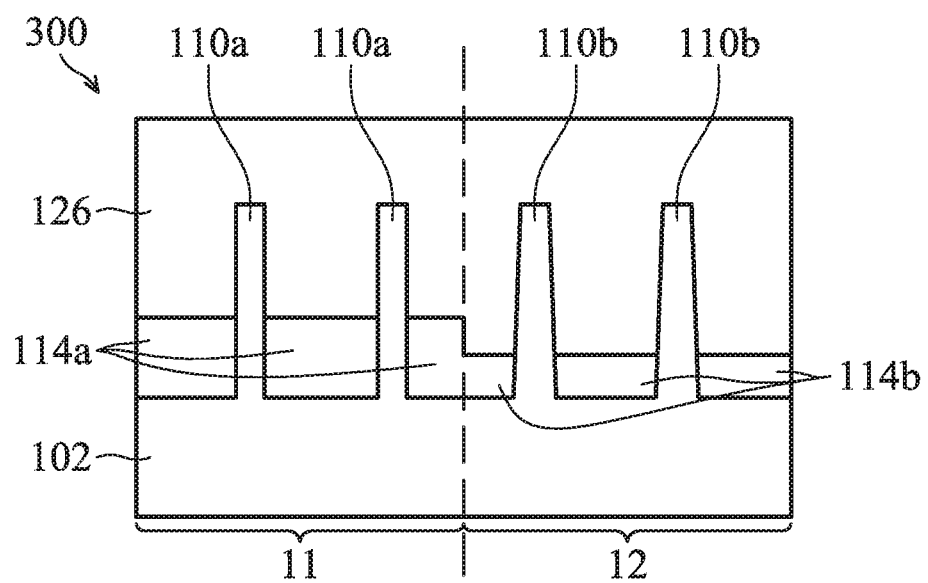

Next, as shown in FIGS. 5E and 6E, the ILD structure 126 is formed on the fin structures 110a, 110b and the isolation structures 114a, 114b, in accordance with some embodiments. The ILD structure 126 has a first portion in the first region 11 and a second portion in the second region 12. A bottom surface of the first portion of the ILD structure 126 is higher than a bottom surface of the second portion of the ILD structure 126. Afterwards, the FinFET device structure 300 continues to form other devices or structures.

In the third embodiment, the FinFET device structure 300 is formed to have different fin profiles and different fin heights. The first fin structures 110a in the first region 11 have straighter sidewall surfaces and lower first fin height $H_1$, and the second fin structures 110b in the second region 12 have sloped sidewall surfaces and higher second fin height $H_2$. By forming different fin profiles and fin heights, the cutoff frequency (Ft) of FinFET device structure 300 is improved. Therefore, the FinFET device structure 300 can be used in the high-frequency device.

FIGS. 7A-7D show perspective representations of various stages of forming a FinFET device structure 400, in accordance with some embodiments of the disclosure. FIGS. 8A-8D show cross-sectional representations of various stages of forming the FinFET device structure 400 shown in FIGS. 7A-7D. FIGS. 8A-8D show cross-sectional representations taken along line aa' in FIGS. 7A-7D. Some processes and materials used to form the FinFET device structure 400 are similar to, or the same as, those used to form the FinFET structure 100 and are not repeated herein.

Figure 7A:
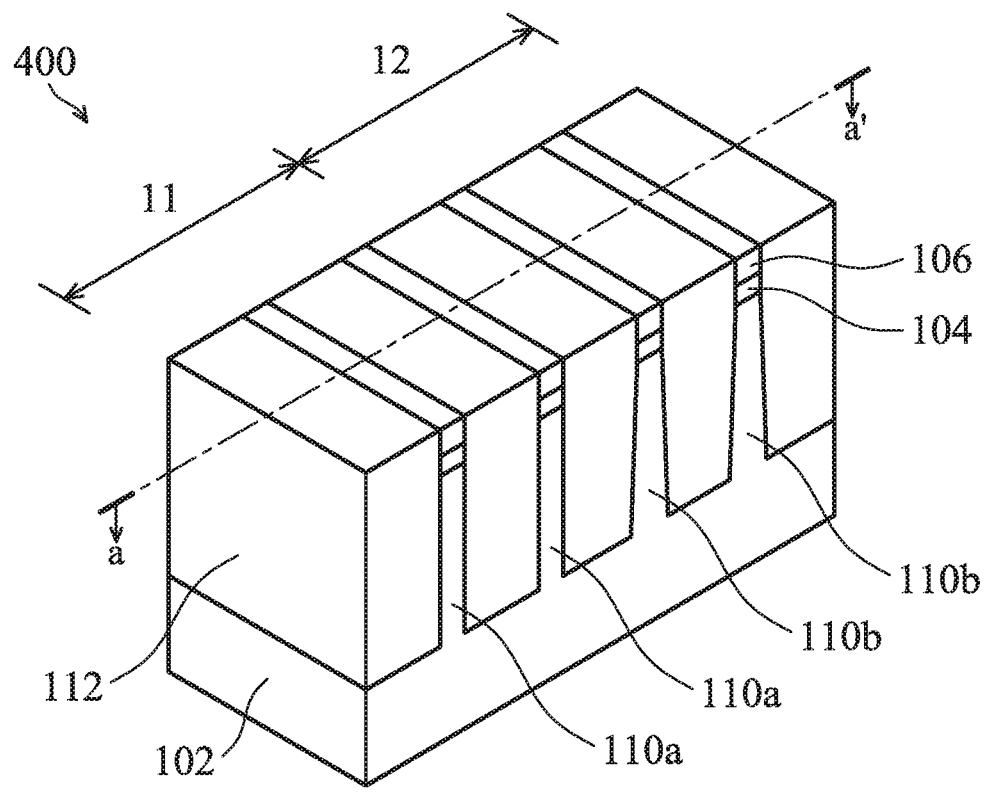
FIGS. 7A-7D show perspective representations of various stages of forming a FinFET device structure, in accordance with some embodiments of the disclosure.
Figure 8A:
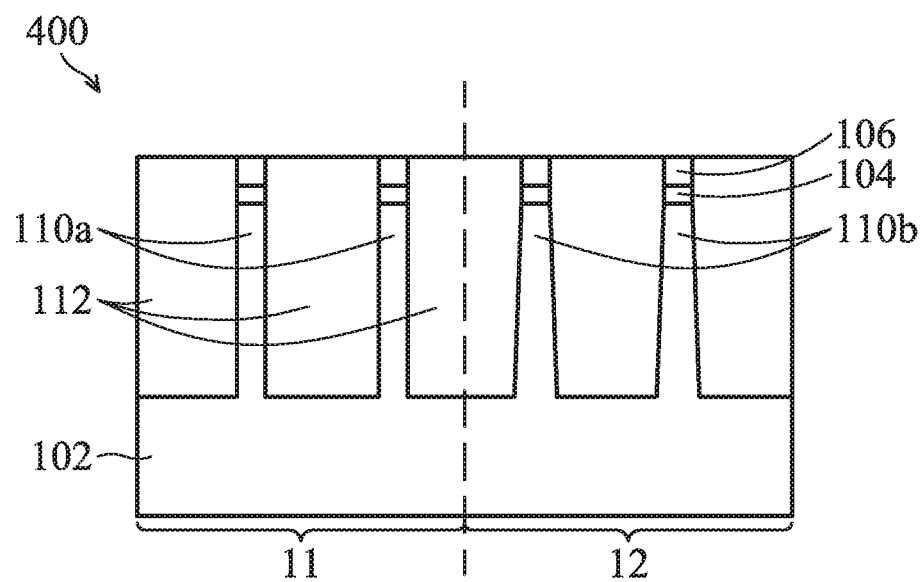
FIGS. 8A-8D show cross-sectional representations of various stages of forming the FinFET device structure shown in FIGS. 7A-7D.

As shown in FIGS. 7A and 8A, each of the first fin structures 110a in the first region 11 has constant fin width, and each of the second fin structures 110b in the second region 12 has a tapered width which is gradually tapered from the bottom portion to the top portion. The isolation layer 112 over the fin structures 110a, 110b and then is thinned or planarized to expose the top surface of the patterned mask layer 106. In some embodiments, the insulating layer 112 is thinned by a chemical mechanical polishing (CMP) process.

Figure 7B:
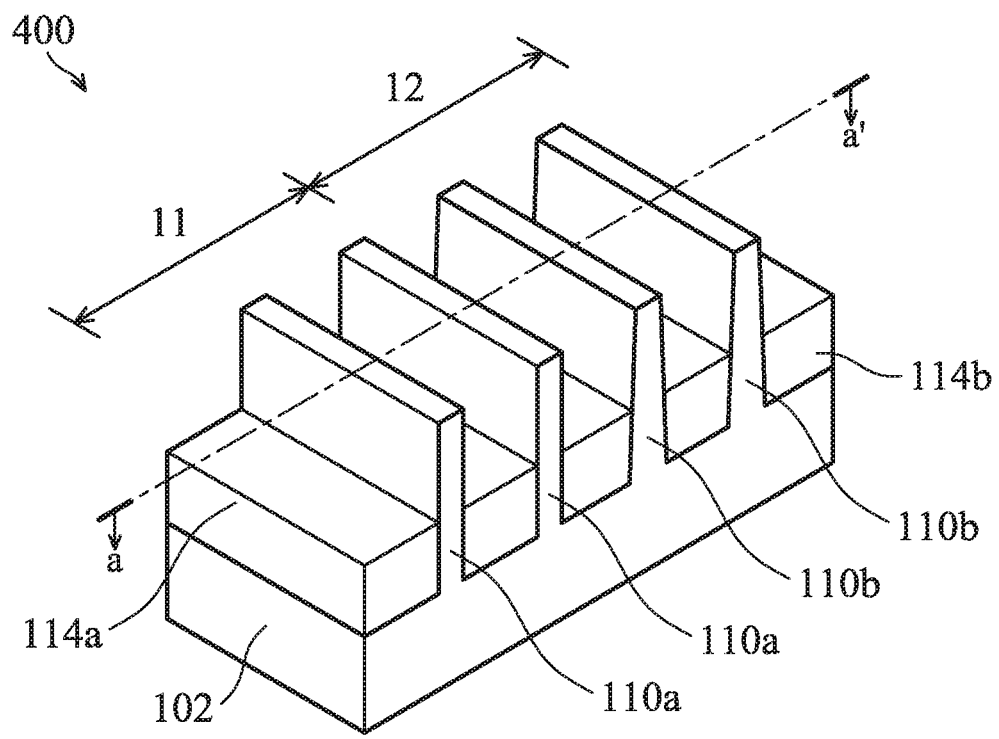
Figure 8B:
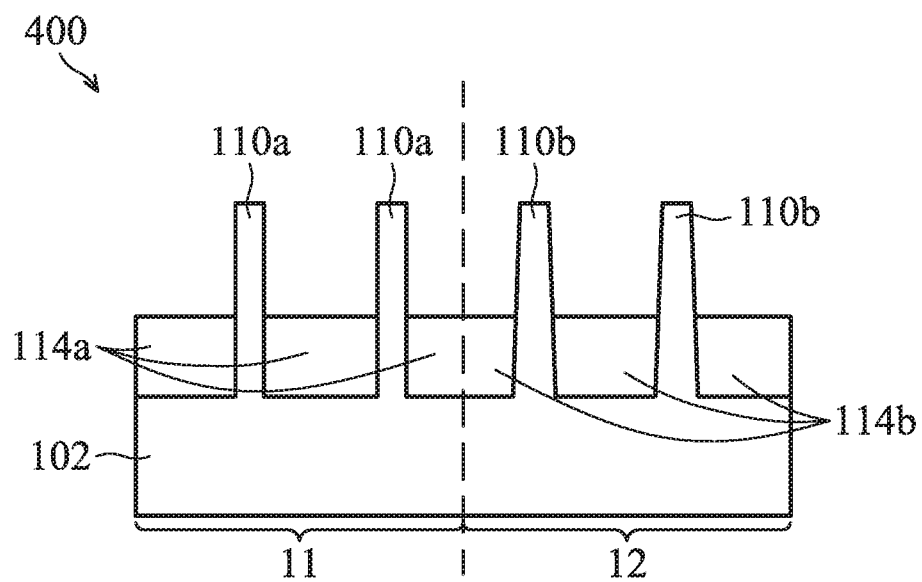

Next, as shown in FIGS. 7B and 8B, a portion of the insulating layer 112 is removed to form a number of isolation structures 114, in accordance with some embodiments. In addition, the patterned dielectric layer 104 and the patterned mask layer 106 are removed. The first isolation structures 114a over the first region 11 and the second isolation structures 114b over the second region 12 both have the same height.

Figure 7C:
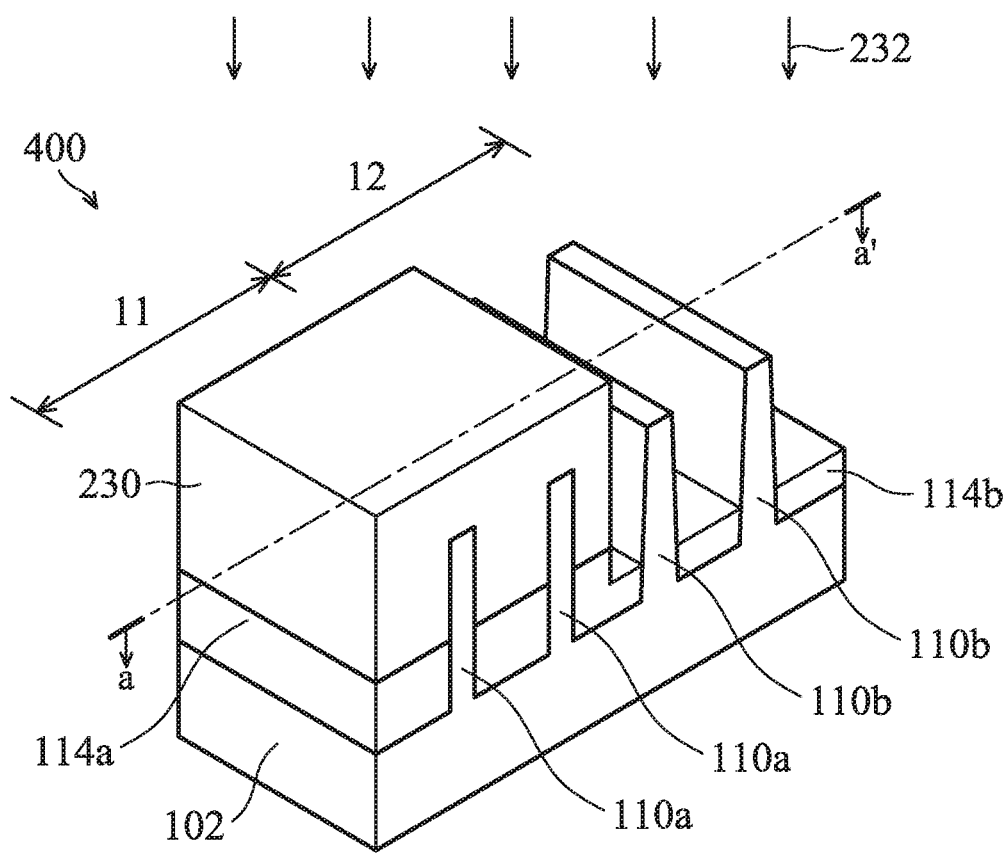
Figure 8C:
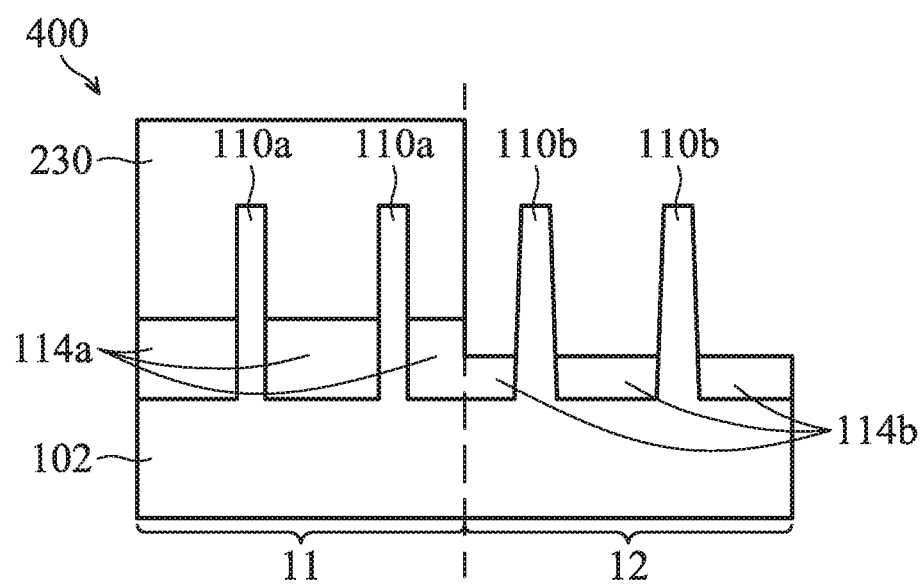

Afterwards, as shown in FIGS. 7C and 8C, a mask layer 230 is formed over the first fin structures 110a and the first isolation structures 114a, and a portion of the second isolation structures 114b is removed, in accordance with some embodiments. In some embodiments, an etching process 232 is performed on the second isolation structures 114b to remove the portion of the second isolation structures 114b.

Figure 7D:
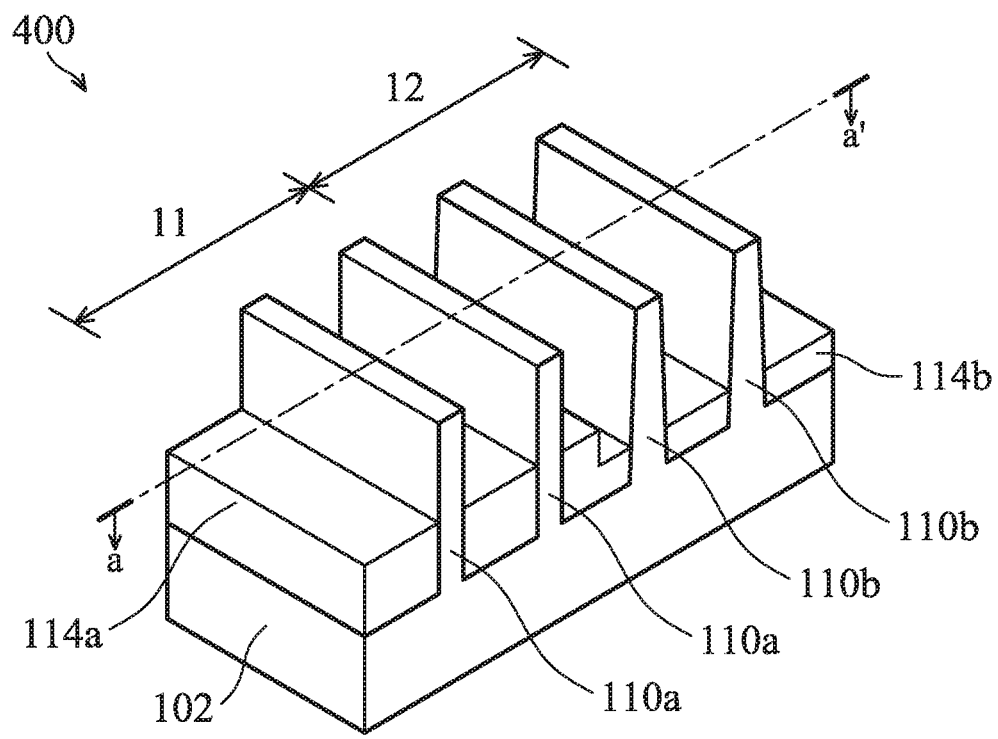
Figure 8D:
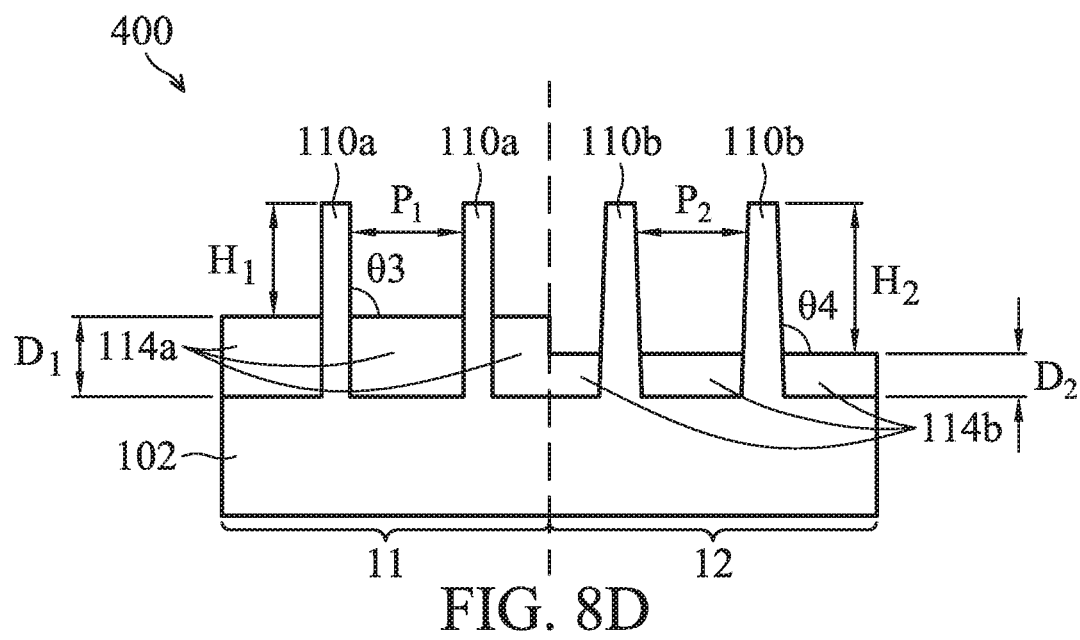

Next, as shown in FIGS. 7D and 8D, after the etching process 232, the mask layer 230 is removed, in accordance with some embodiments. The mask layer 230 may be removed by a dry etching process or a wet etching process.

The first fin structures 110a in the first region 11 and the second fin structures 110b in the second region 12 have different fin profiles and different fin heights. The second fin structures 110b in the second region 12 are etched twice and have sloped sidewall surfaces. Afterwards, the FinFET device structure 400 continues to form other devices and structures.

In the fourth embodiment, the FinFET device structure 400 is formed to have different fin profiles and different fin heights. The first fin structures 110a in the first region 11 have straighter sidewall surfaces and lower first fin height $H_1$, and the second fin structures 110b in the second region 12 have sloped sidewall surfaces and higher second fin height $H_2$. By forming different fin profiles and fin heights, the cutoff frequency (Ft) of FinFET device structure 400 is improved. Therefore, the FinFET device structure 400 can be used in the high-frequency device.

In the first embodiment, the first fin structures 110a and the second fin structures 110b have different fin heights. In the second embodiment, the first fin structures 110a and the second fin structures 110b have different fin profiles. In the third and fourth embodiments, the first fin structures 110a and the second fin structures 110b have different fin heights and have different fin profiles. By forming the different fin height and/or different fin profiles, the parasite capacitance (C) of the FinFET device structures 100, 200, 300, 400 may be reduced and therefore the cutoff frequency (Ft) of the FinFET device structures 100, 200, 300, 400 is improved.

Embodiments for forming a FinFET device structure and method for formation of the same are provided. The FinFET device structure includes an isolation structure formed over a substrate, and a fin structure extends from the isolation structure. The FinFET device structure with different fin heights is achieved by using two etching processes. A portion of the isolation structures is etched twice to control the etching amount more precisely. The FinFET device structure with different fin heights and/or different fin profiles to reduce the parasite capacitance (C) of the FinFET device structures. Therefore, the performance of the FinFET device structures is improved.

In some embodiments, a FinFET device structure is provided. The FinFET device structure includes a first fin structure over a substrate, and a second fin structure over the substrate. The FinFET device structure also includes a first isolation structure over the substrate and surrounding the first fin structure. The first fin structure is protruded from a top surface of the first isolation structure. The FinFET device structure further includes a second isolation structure over the substrate and surrounding the second fin structure. The second fin structure is protruded from a top surface of the second isolation structure, and the first fin structure has a vertical sidewall surface and the second fin structure has a sloped sidewall surface.

In some embodiments, a FinFET device structure is provided. The FinFET device structure includes a first fin structure over a first region of a substrate, and a second fin structure over a second region of the substrate. The FinFET device structure also includes a first isolation structure over the first region. The first fin structure is protruded from a top surface of the first isolation structure. The FinFET device structure further includes a second isolation structure over the second region. The second fin structure is protruded from a top surface of the second isolation structure. A first angle is between a sidewall surface of the first fin structure and the top surface of the first isolation structure, a second angle is between a sidewall surface of the second fin structure and the top surface of the second isolation structure, and the first angle is smaller than the second angle.

In some embodiments, a FinFET device structure is provided. The FinFET device structure includes a first isolation structure over a substrate and a second isolation structure over the substrate. The FinFET device structure also includes a first fin structure extended above the first isolation structure, and the first fin structure has a constant fin width from a bottom portion to a top portion, the first fin structure has a first fin height measured from a top surface of the first fin structure to a top surface of the first isolation structure. The FinFET device structure further includes a second fin structure extended above the second isolation structure, and the second fin structure has a tapered fin width which is tapered from a bottom portion to a top portion, and the second fin structure has a second fin height measured from a top surface of the second fin structure to a top surface of the second isolation structure, and the first fin height is smaller than the second fin height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
   a first fin structure and a third fin structure over a substrate, wherein the first fin structure and the third fin structure have vertical sidewall surfaces;
   a second fin structure and a fourth fin structure over the substrate, wherein the second fin structure and the fourth fin structure have sloped sidewall surfaces;
   a first isolation structure over the substrate and surrounding the first fin structure and the third fin structure, wherein the first isolation structure has a first top surface extending between the vertical sidewall surfaces of the first fin structure and the third fin structure;
   a second isolation structure over the substrate and surrounding the second fin structure and the fourth fin structure, wherein the second isolation structure has a second top surface extending between the sloped sidewall surfaces of the second fin structure and the fourth fin structure, wherein the second top surface of the second isolation structure is lower than the first top surface of the first isolation structure,
   wherein the first fin structure and the third fin structure have a first width at a bottom of the first isolation structure smaller than a second width of the second fin structure and the fourth fin structure at a bottom of the second isolation structure; and
   a gate dielectric layer over the first fin structure, the second fin structure, the third fin structure, the fourth fin structure, the first isolation structure and the second isolation structure, wherein
   a first pitch between the vertical sidewall surface of the first fin structure and the third fin structure is smaller than a second pitch between the sloped sidewall surface of the second fin structure and the fourth fin structure.

2. The fin field effect transistor (FinFET) device structure as claimed in claim 1, wherein the first width is a constant fin width from a bottom portion to a top portion, and the second fin structure has a tapered fin width which is tapered from a bottom portion to a top portion.

3. The fin field effect transistor (FinFET) device structure as claimed in claim 2, wherein the bottom portion of the second fin structure is lower than the second top surface of the second isolation structure.

4. The fin field effect transistor (FinFET) device structure as claimed in claim 1, wherein the first fin structure has a height measured from a top surface of the first fin structure to the first top surface of the first isolation structure, the second fin structure has a height measured from a top surface of the second fin structure to the second top surface of the second isolation structure, and the height of the second fin structure is greater than the height of the first fin structure.

5. The fin field effect transistor (FinFET) device structure as claimed in claim 1, wherein the first isolation structure has a sidewall protruded from the second top surface of the second isolation structure, and the gate dielectric layer extends to cover the sidewall of the first isolation structure.

6. The fin field effect transistor (FinFET) device structure as claimed in claim 5, further comprising:
   a gate electrode layer over the gate dielectric layer, wherein the gate electrode layer extends between the sidewall of the first isolation structure and the second fin structure.

7. A fin field effect transistor (FinFET) device structure, comprising:
   a first fin structure having first sidewalls and a third fin structure having third sidewalls over a first region of a substrate;
   a second fin structure having second sidewalls and a fourth fin structure having fourth sidewalls over a second region of the substrate;
   a first isolation structure over the first region, wherein the first fin structure and the third fin structure are protruded from a first top surface of the first isolation structure;
   a second isolation structure over the second region, wherein the second fin structure and the fourth fin structure are protruded from a second top surface of the second isolation structure, and
   wherein a first angle is between one of the first sidewalls of the first fin structure and the first top surface of the first isolation structure, a second angle is between one of the second sidewalls of the second fin structure and the second top surface of the second isolation structure, and the first angle is smaller than the second angle, and the first top surface of the first isolation structure is higher than the second top surface of the second isolation structure, and
   wherein the first fin structure and the third fin structure have a constant fin width from a bottom portion to a top portion between the first sidewalls and the third sidewalls respectively, and the constant fin width of the first fin structure and the third fin structure is smaller than a width of the second fin structure and the fourth fin structure at the second top surface of the second isolation structure; and a gate dielectric layer over the first fin structure, the second fin structure, the third fin structure, the fourth fin structure, the first isolation structure and the second isolation structure, wherein a first distance between a top portion of the gate dielectric layer on one of the first sidewalls of the first fin structure and a top portion of the gate dielectric layer on one of the third sidewalls of the third fin structure is smaller than a second distance between a top portion of the gate dielectric layer on one of the second sidewalls of the second fin structure and a top portion of the gate dielectric layer on one of the fourth sidewalls of the fourth fin structure, wherein the top portion of the gate dielectric layer on one of the first sidewalls of the first fin structure faces the top portion of the gate dielectric layer on one of the third sidewalls of the third fin structure, and the top portion of the gate dielectric layer on one of the second sidewalls of the second fin structure faces the top portion of the gate dielectric layer on one of the fourth sidewalls of the fourth fin structure.

8. The fin field effect transistor (FinFET) device structure as claimed in claim 7, wherein one of the first sidewalls of the first fin structure is substantially orthogonal to the second top surface of the first isolation structure.

9. The fin field effect transistor (FinFET) device structure as claimed in claim 7, wherein, a sidewall of the first isolation structure adjoins the first top surface of the first isolation structure and the second top surface of the second isolation structure, and the sidewall of the first isolation structure is substantially orthogonal to the second top surface of the second isolation structure.

10. The fin field effect transistor (FinFET) device structure as claimed in claim 7, further comprising:
a gate electrode layer over the gate dielectric layer, wherein a portion of the gate dielectric layer and a portion of the gate electrode layer are sandwiched between the first isolation structure and the second fin structure.

11. The fin field effect transistor (FinFET) device structure as claimed in claim 10, wherein a bottom surface of the gate electrode layer over the first isolation structure is higher than a bottom surface of the gate electrode layer over the second isolation structure.

12. The fin field effect transistor (FinFET) device structure as claimed in claim 7,
wherein a distance between the first fin structure and the third fin structure is greater than a distance between the second fin structure and the fourth fin structure.

13. The fin field effect transistor (FinFET) device structure as claimed in claim 7, wherein an angle difference between the first angle and the second angle is in a range from about 0 degree to about 30 degrees.

14. The fin field effect transistor (FinFET) device structure as claimed in claim 10, wherein a width of a portion of the gate electrode layer sandwiched between the second fin structure and the third fin structure continuously decrease from a level at a top surface of the second fin structure to a level at the second top surface of the second isolation structure.

15. The fin field effect transistor (FinFET) device structure as claimed in claim 10, wherein a width of a portion of the gate electrode layer sandwiched between the second fin structure and the third fin structure continuously decrease from a level at a top surface of the third fin structure to a level at the first top surface of the first isolation structure.

16. A fin field effect transistor (FinFET) device structure, comprising:
a first isolation structure over a substrate;
a second isolation structure over the substrate;
a first fin structure and a third fin structure having vertical sidewall surfaces extending through and protruding from a first top surface of the first isolation structure, wherein the first fin structure and the third fin structure have a constant fin width from a bottom portion to a top portion, the first fin structure has a first fin height measured from a first top surface of the first fin structure to the first top surface of the first isolation structure;
a second fin structure and a fourth fin structure having sloped sidewall surfaces extending through and protruding from a second top surface of the second isolation structure, wherein the second fin structure and the fourth fin structure have a tapered fin width which is tapered from a bottom portion to a top portion, and the second fin structure has a second fin height measured from a second top surface of the second fin structure to the second top surface of the second isolation structure, and the first fin height is smaller than the second fin height, and
wherein the constant fin width of the first fin structure and the third fin structure is smaller than the tapered fin width of the second fin structure and the fourth fin structure; and
a gate dielectric layer over the first fin structure, the second fin structure, the third fin structure, the fourth fin structure, the first isolation structure and the second isolation structure, wherein
a first pitch between the vertical sidewall surface of the first fin structure and the third fin structure is smaller than a second pitch between the sloped sidewall surface of the second fin structure and the fourth fin structure, and the first top surface of the first isolation structure between the vertical sidewall surface of the first fin structure and the third fin structure is higher than the second top surface of the second isolation structure between the sloped sidewall surface of the second fin structure and the fourth fin structure.

17. The fin field effect transistor (FinFET) device structure as claimed in claim 16, further comprising:
an inter-layer dielectric (ILD) structure over the first isolation structure and the second isolation structure, wherein the ILD structure has a first portion over the first isolation structure and a second portion over the second isolation structure, and a bottom surface of the first portion is higher than a bottom surface of the second portion of the ILD structure.

18. The fin field effect transistor (FinFET) device structure as claimed in claim 16, wherein the first isolation structure has a first depth, the second isolation structure has a second depth, and the first depth is greater than the second depth.

19. The fin field effect transistor (FinFET) device structure as claimed in claim 16, wherein the first fin height is in a range from about 40 nm to about 60 nm, and the second fin height is in a range from about 40.1 nm to about 80 nm.

20. The fin field effect transistor (FinFET) device structure as claimed in claim 19, wherein a height difference between the first fin height and the second fin height is in a range from about 0.1 nm to about 20 nm.

* * * * *